(12) United States Patent
Nakajima

(10) Patent No.: US 6,870,275 B2
(45) Date of Patent: Mar. 22, 2005

(54) SEMICONDUCTOR DEVICE, IMAGE SCANNING UNIT INCLUDING THE SEMICONDUCTOR DEVICE, AND IMAGE FORMING APPARATUS INCLUDING THE IMAGE SCANNING UNIT

(75) Inventor: Mitsuru Nakajima, Atsugi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/393,973

(22) Filed: Mar. 24, 2003

(65) Prior Publication Data

US 2004/0016982 A1 Jan. 29, 2004

(30) Foreign Application Priority Data

Mar. 22, 2002 (JP) ........................................ 2002-081037

(51) Int. Cl.$^7$ .......................... H01L 23/52; H01L 23/48; H01L 29/40
(52) U.S. Cl. ........................ 257/783; 257/691; 257/735; 257/737; 257/778
(58) Field of Search ............................... 257/691, 713, 257/783, 735, 737, 778; 438/118

(56) References Cited

U.S. PATENT DOCUMENTS

| | | | | |
|---|---|---|---|---|
| 5,721,450 A | * | 2/1998 | Miles ......................... | 257/667 |
| 5,969,461 A | * | 10/1999 | Anderson et al. ....... | 310/313 R |
| 6,053,029 A | | 4/2000 | Hiramatsu et al. | |
| 6,093,972 A | * | 7/2000 | Carney et al. .............. | 257/790 |
| 6,212,754 B1 | | 4/2001 | Hiramatsu et al. | |
| 6,214,644 B1 | * | 4/2001 | Glenn ......................... | 438/108 |
| 6,223,424 B1 | | 5/2001 | Hiramatsu et al. | |
| 6,226,851 B1 | | 5/2001 | Hiramatsu et al. | |
| 6,234,003 B1 | | 5/2001 | Hiramatsu et al. | |
| 6,396,043 B1 | * | 5/2002 | Glenn et al. ............. | 250/208.1 |
| 6,406,941 B2 | * | 6/2002 | Nakamura ................... | 438/116 |
| 6,472,247 B1 | * | 10/2002 | Andoh et al. ................. | 438/64 |
| 6,472,761 B2 | * | 10/2002 | Nakamura ................... | 257/778 |
| 6,693,348 B2 | * | 2/2004 | Nakajima .................... | 257/691 |
| 6,762,492 B2 | * | 7/2004 | Nakajima et al. ........... | 257/714 |

FOREIGN PATENT DOCUMENTS

JP     5-218230     8/1993

* cited by examiner

*Primary Examiner*—Nathan J. Flynn
*Assistant Examiner*—Victor A. Mandala, Jr.
(74) *Attorney, Agent, or Firm*—Oblon, Spivak, McClelland, Maier & Neustadt, P.C.

(57) ABSTRACT

A semiconductor device includes a semiconductor chip with a functional surface, a substrate opposing the functional surface of the semiconductor chip at a space formed between the substrate and the functional surface, a power supplying device electrically connected to a part of the functional surface of the semiconductor chip and separated by a slight gap from the substrate, a fixing member that fixes the semiconductor chip to the substrate, and a sealing member that seals the space formed between the substrate and the functional surface of the semiconductor chip other than a space formed between the substrate and the functional surface of the semiconductor chip that are fixed to each other through the fixing member and other than the gap formed between the power supplying device and the substrate. The sealing member has greater elasticity than the fixing member.

33 Claims, 13 Drawing Sheets

SEMICONDUCTOR DEVICE, IMAGE SCANNING UNIT INCLUDING THE SEMICONDUCTOR DEVICE, AND IMAGE FORMING APPARATUS INCLUDING THE IMAGE SCANNING UNIT

CROSS-REFERENCE TO RELATED APPLICATIONS

The present application claims priority to Japanese Patent Application No. 2002-081037 filed in the Japanese Patent Office on Mar. 22, 2002, the disclosure of which is incorporated herein by reference.

BACKGROUND OF THE INVENTION

1. Field of the Invention

The present invention relates to a semiconductor device which can prevent the breakage of an electrical conjunction portion due to thermal expansion, and to an image scanning unit including the semiconductor device, and to an image forming apparatus including the image scanning unit.

2. Discussion of the Background

As a background bonding technology, a wireless bonding method is known. As compared to a wire bonding method in which bonding pads on a semiconductor chip and a lead on a substrate are electrically connected with a metal fine line, the wireless bonding method has advantages in the high densification of contact pins and the decrease of the size of a semiconductor device. A facedown bonding method is one of the wireless bonding methods. In the facedown bonding method, a bump or a beam lead is formed on a bonding pad of a semiconductor chip, and the chip surface of the semiconductor chip is directly connected onto a conductor layer of a substrate with the chip surface faced down. A typical facedown bonding method is commonly referred to as flip chip.

With recent increasing demands for decrease of the size of a semiconductor device, a semiconductor chip has been bonded to a substrate by means of a facedown bonding method for downsizing the package of the semiconductor chip and the substrate.

When a semiconductor chip is bonded to a substrate by a facedown bonding method, in order to prevent an electrical breakage at a conjunction portion in a circuit caused by a difference in the coefficients of thermal expansion between the semiconductor chip and the substrate, an adhesive material or a sealing compound is used between the semiconductor chip and the substrate.

Generally, the thermal expansion becomes large in proportion to a difference in temperature and a length of an object. The amount of thermal expansion depends on the coefficient of thermal expansion of the material of an object. Therefore, in the case of a long semiconductor device such as a line charge-coupled device (CCD) for use in a copying machine, a facsimile machine, a scanner, or other similar image forming apparatus, the amount of thermal expansion increases especially in the longitudinal direction of the semiconductor device.

For the above-described reasons, even when an adhesive material or a sealing compound is used between a semiconductor chip and a substrate, an electrical conjunction portion moves because the difference in the amount of thermal expansion between the semiconductor chip and the substrate is large. As a result, the problem resulting from the breakage of an electrical conjunction portion occurs.

Another problem arises when the functional surface of a semiconductor chip does not remain in an airtight condition. In this case, the functional surface and the electrode surface of the semiconductor chip are oxidized due to the moisture in the air, resulting in a conduction failure. In addition, when a semiconductor chip is used as a solid-state imaging device having an optical functional surface and when a foreign substance such as dust adheres to the optical functional surface, the optical property of the solid-state imaging device is adversely influenced.

Therefore, it is desirable to provide a semiconductor device which can prevent the breakage of an electrical conjunction portion due to thermal expansion and a functional surface of a semiconductor chip which is protected from moisture and foreign substances.

SUMMARY OF THE INVENTION

According to one aspect of the present invention, a semiconductor device includes a semiconductor chip having a functional surface, and a substrate configured to support the semiconductor chip. The substrate opposes the functional surface of the semiconductor chip at a space formed between the substrate and the functional surface. The semiconductor device further includes a power supplying device configured to supply electric power to the semiconductor chip while being electrically connected to a part of the functional surface of the semiconductor chip. The power supplying device is interposed between the functional surface of the semiconductor chip and the substrate. Further, the power supplying device is separated by a slight gap from the substrate. The semiconductor device further includes a fixing member configured to fix the semiconductor chip to the substrate. The fixing member is disposed beside a part of the functional surface of the semiconductor chip other than the part of the functional surface of the semiconductor chip connected to the power supplying device. The semiconductor device further includes a sealing member configured to seal the space formed between the substrate and the functional surface of the semiconductor chip other than a space formed between the substrate and the functional surface of the semiconductor chip that are fixed to each other through the fixing member and other than the gap formed between the power supplying device and the substrate. The sealing member also has greater elasticity than the fixing member.

According to another aspect of the present invention, an image scanning unit includes an optical element, and a semiconductor device. The semiconductor device includes a solid-state imaging device including an optical functional surface, and a substrate configured to support the solid-state imaging device. The substrate includes a light transparent material, and opposes the optical functional surface of the solid-state imaging device at the space formed between the substrate and the optical functional surface. A light incident space forms between the optical functional surface of the solid-state imaging device and the substrate. The semiconductor device further includes a power supplying device configured to supply electric power to the solid-state imaging device while being electrically connected to a part of the optical functional surface of the solid-state imaging device. The power supplying device is interposed between the optical functional surface of the solid-state imaging device and the substrate, and the power supplying device is separated by a slight gap from the substrate. The semiconductor device further includes a fixing member configured to fix the solid-state imaging device to the substrate. The fixing member is disposed beside a part of the optical functional surface of the solid-state imaging device other than the part of the optical functional surface of the solid-state imaging device connected to the power supplying device. The semiconductor device further includes a sealing member configured to seal the space formed between the substrate and the optical functional surface of the solid-state imaging device other than the space formed between the substrate and the optical functional surface of the solid-state imaging device that are fixed to each other through the fixing member and other than the gap formed between the power supplying device and the substrate. The sealing member has greater elasticity than the fixing member.

According to a further aspect of the present invention, an image forming apparatus includes an image carrier configured to carry an image, and an image scanning unit including an optical element and a semiconductor device. The semiconductor device includes a solid-state imaging device including an optical functional surface, and a substrate configured to support the solid-state imaging device. The substrate includes a light transparent material, and opposes the optical functional surface of the solid-state imaging device at the space formed between the substrate and the optical functional surface. A light incident space forms between the optical functional surface of the solid-state imaging device and the substrate. The semiconductor device further includes a power supplying device configured to supply electric power to the solid-state imaging device while being electrically connected to a part of the optical functional surface of the solid-state imaging device. The power supplying device is interposed between the optical functional surface of the solid-state imaging device and the substrate, and the power supplying device is separated by a slight gap from the substrate. The semiconductor device further includes a fixing member configured to fix the solid-state imaging device to the substrate. The fixing member is disposed beside a part of the optical functional surface of the solid-state imaging device other than the part of the optical functional surface of the solid-state imaging device connected to the power supplying device. The semiconductor device further includes a sealing member configured to seal the space formed between the substrate and the optical functional surface of the solid-state imaging device other than the space formed between the substrate and the optical functional surface of the solid-state imaging device that are fixed to each other through the fixing member and other than the gap formed between the power supplying device and the substrate. The sealing member also has greater elasticity than the fixing member.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
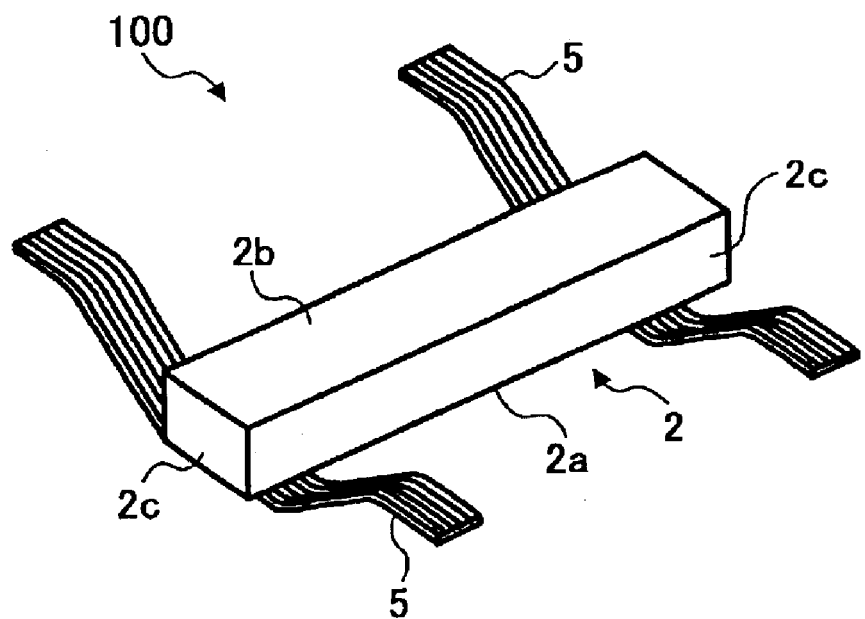
FIG. 1 is a perspective view of an entire structure of an assembly included in a semiconductor device according to one embodiment of the present invention.

Preferred embodiments of the present invention are described in detail referring to the drawings, wherein like reference numerals designate identical or corresponding parts throughout the several views.

Figure 2:
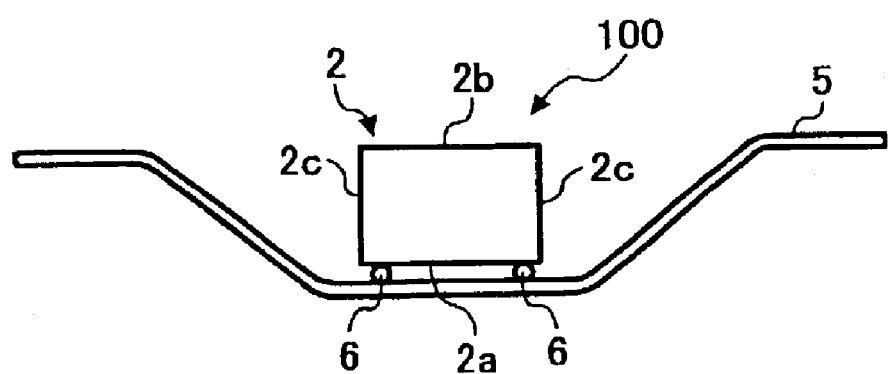
FIG. 2 is a cross-sectional view of the assembly of FIG. 1 along a direction perpendicular to a longitudinal direction of the assembly.

FIG. 1 is a perspective view of an entire structure of an assembly included in a semiconductor device according to one embodiment of the present invention. FIG. 2 is a cross-sectional view of the assembly of FIG. 1 along a direction perpendicular to a longitudinal direction of the assembly.

As illustrated in FIG. 1, an assembly 100 includes a semiconductor chip 2 which is a bare chip and a pair of power supplying devices 5 bonded to the semiconductor chip 2 by a flip chip bonding method. The semiconductor chip 2 is in the shape of an approximately rectangular solid, and includes a functional surface 2a as a circuit surface formed at a bottom side of the semiconductor chip 2 in FIG. 1, side surfaces 2c provided on the periphery of the functional surface 2a in a standing condition, and a back surface 2b (i.e., an upper surface in FIG. 1) formed on the opposite side of the functional surface 2a of the semiconductor ship 2. The back surface 2b of the semiconductor chip 2 is exposed to outside for radiating the heat of the semiconductor chip 2 to reduce the deformation of the semiconductor chip 2. The power supplying device 5 is formed from, for example, a flexible circuit board.

As illustrated in FIG. 2, electrodes 6 as bumps (connecting electrodes in a protruding condition) made of a material such as solder or gold are provided on the functional surface 2a of the semiconductor chip 2. The circuit on the functional surface 2a and the power supplying device 5 are electrically connected to each other through the electrodes 6. The functional surface 2a of the semiconductor chip 2 and the power supplying device 5 are bonded by a facedown bonding method, such as flip chip bonding, tape automated bonding (TAB), beam lead bonding, and the like. Therefore, the functional surface 2a of the semiconductor chip 2 and the power supplying device 5 may or may not be bonded with an adhesive material. The functional surface 2a of the semiconductor chip 2 and the power supplying device 5 illustrated in FIG. 2 are bonded by a flip chip bonding method as one non-limiting example.

Figure 3:
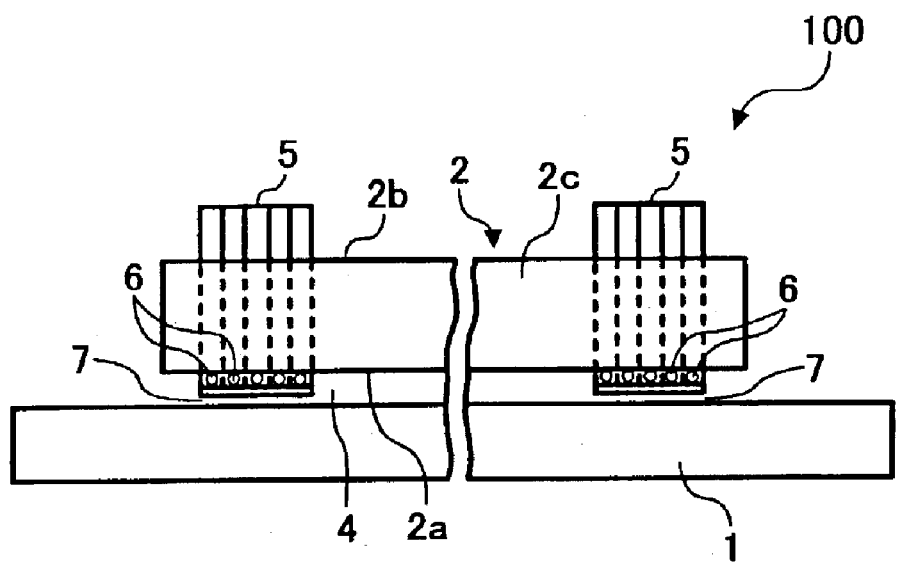
FIG. 3 is a schematic view of a semiconductor device during assembly according to a first embodiment of the present invention.

FIG. 3 is a schematic view of a semiconductor device during assembly according to the first embodiment of the present invention. The horizontal direction in FIG. 3 corresponds to the longitudinal direction of the assembly 100.

As illustrated in FIG. 3, the assembly 100 and a substrate 1 are disposed by a jig (not shown) such that a space 4 forms between the substrate 1 and the semiconductor chip 2. Further, a gap 7 is formed between the power supplying device 5 and the substrate 1, so that the semiconductor chip 2 is not fixed on the substrate 1. The gap 7 is a slight gap of, for example, about 1 $\mu$m or less which does not permit the passage of foreign substances.

Figure 4:
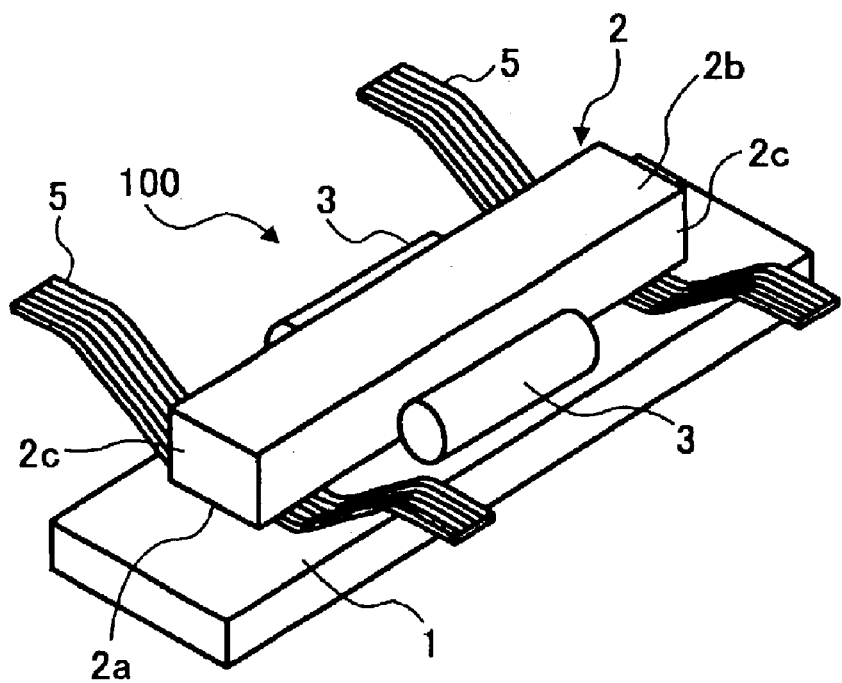
FIG. 4 is a schematic view of a semiconductor device in an assembly step subsequent to an assembly step in FIG. 3.
Figure 5:
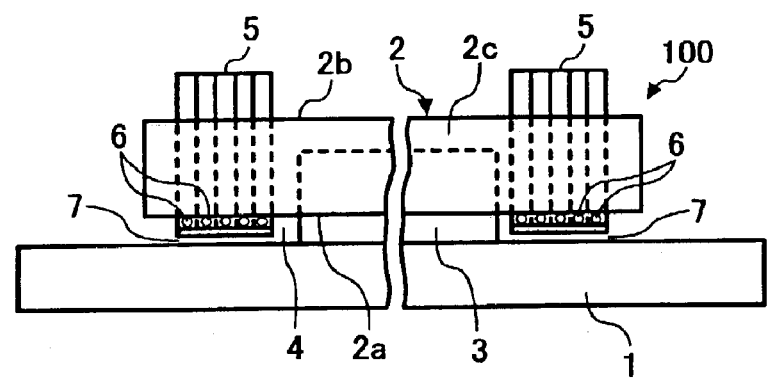
FIG. 5 is a cross-sectional view of the semiconductor device of FIG. 4 along a longitudinal direction of a semiconductor chip of the semiconductor device.

FIG. 4 is a schematic view of a semiconductor device in an assembly step subsequent to the assembly step in FIG. 3. FIG. 5 is a cross-sectional view of the semiconductor device of FIG. 4 along a longitudinal direction of the semiconductor chip of the semiconductor device. As illustrated in FIG. 4, the assembly 100 in which the power supplying device 5 is bonded to the semiconductor chip 2 by the flip chip bonding method, adheres to the substrate 1 through adhesive materials 3. The semiconductor chip 2 is fixed to the substrate 1 at a portion where the assembly 100 adheres to the substrate 1 through the adhesive materials 3. Specifically, the semiconductor chip 2 is fixed to the substrate 1 through the adhesive materials 3 serving as a fixing member at a part beside a part of the functional surface 2a of the semiconductor chip 2 other than the part of the functional surface 2a connected to the power supplying device 5 (e.g., at a part between the pair of power supplying devices 5 in this embodiment).

As illustrated in FIG. 5, the assembly 100 adheres and is fixed to the substrate 1 through the adhesive materials 3. In this condition, the space 4 forms between the substrate 1 and the semiconductor chip 2. In addition, the gap 7 forms between the power supplying device 5 and the substrate 1, so that the power supplying device 5 is not fixed to the substrate 1. Although not shown, it may be possible to fix the power supplying device 5 to the substrate 1 except at the portion of the power supplying device 5 interposed between the semiconductor chip 2 and the substrate 1.

In the semiconductor device of FIG. 5, the semiconductor chip 2 is fixed to the substrate 1 at a fixed portion where the adhesive materials 3 adhere to the semiconductor chip 2 and the substrate 1. There are additional portions other than the above-described fixed portion of the semiconductor chip 2, the substrate 1, and the gap 7 formed between the power supplying device 5 and the substrate 1, between the side surfaces 2c and the top surface of the substrate 1.

Figure 6:
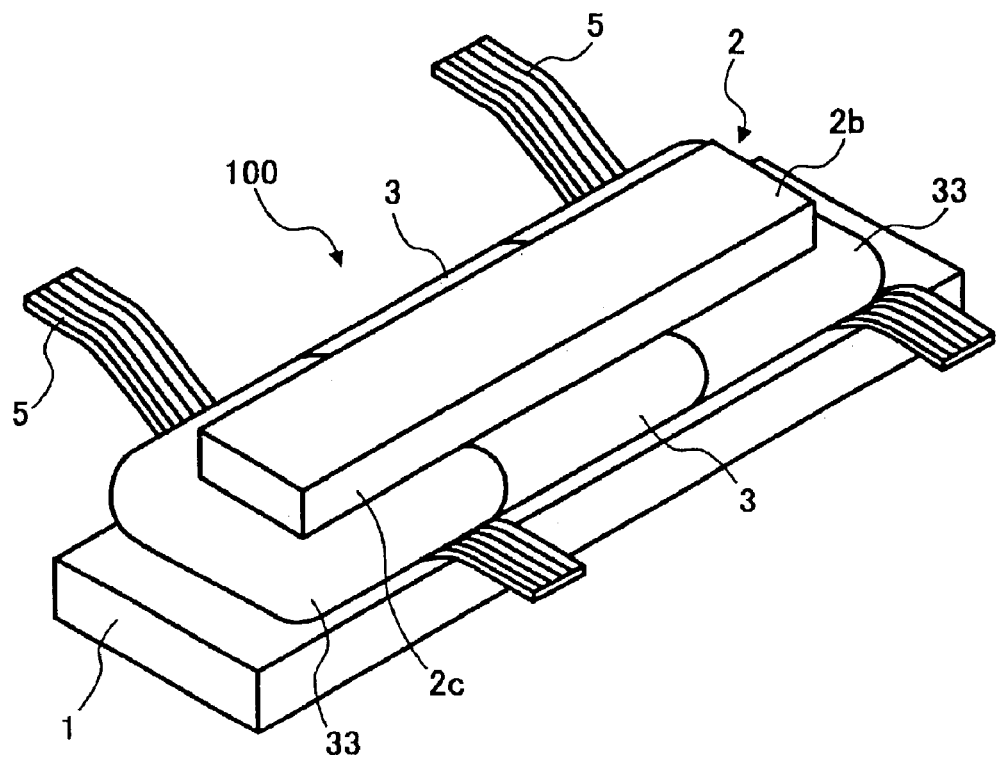
FIG. 6 is a perspective view of an entire structure of the semiconductor device according to the first embodiment of the present invention.
Figure 7:
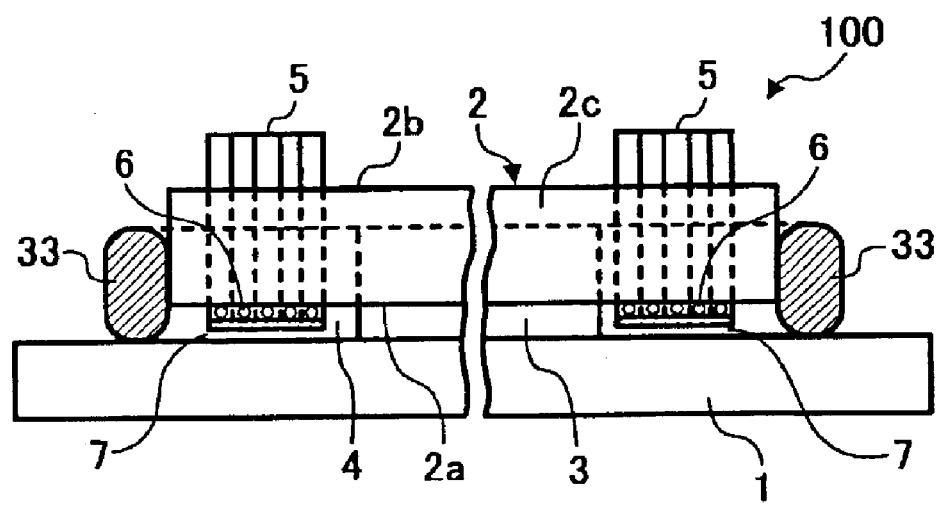
FIG. 7 is a cross-sectional view of the semiconductor device of FIG. 6 along a longitudinal direction of the semiconductor chip of the semiconductor device.
Figure 8:
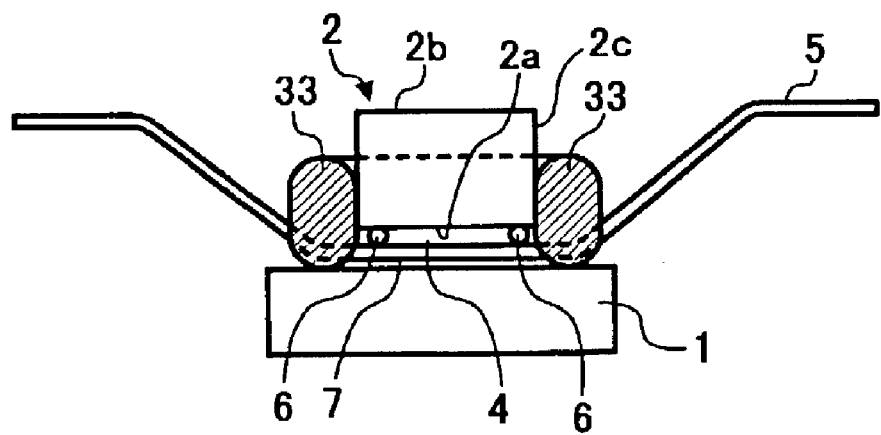
FIG. 8 is a cross-sectional view of the semiconductor device of FIG. 6 along a direction perpendicular to the longitudinal direction of the semiconductor chip of the semiconductor device.

FIG. 6 is a perspective view of the entire structure of the semiconductor device according to the first embodiment of the present invention. FIG. 7 is a cross-sectional view of the semiconductor device of FIG. 6 along a longitudinal direction of the semiconductor chip of the semiconductor device. FIG. 8 is a cross-sectional view of the semiconductor device of FIG. 6 along a direction perpendicular to the longitudinal direction of the semiconductor chip of the semiconductor device.

As illustrated in FIG. 6, the assembly 100 adheres to the substrate 1 through the adhesive material 3. A sealing member 33 is disposed at a portion of the substrate 1 other than the above-described fixed portion of the semiconductor chip 2 and the substrate 1 through the adhesive material 3 and other than the portion corresponding to the gap 7 formed between the power supplying device 5 and the substrate 1. The sealing member 33 is made of an adhesive material, a foaming material, or the like. In the present embodiment, the sealing member 33 has greater elasticity than the adhesive material 3.

In the semiconductor device of FIG. 6, the adhesive material 3 and the sealing member 33 do not adhere to the back surface 2b of the semiconductor chip 2. In addition, the sealing member 33 does not adhere to the functional surface 2a of the semiconductor chip 2 either, specifically, the sealing member 33 is interposed between the side surfaces 2c of the semiconductor chip 2 and the top surface of the substrate 1, thereby sealing the functional surface 2a of the semiconductor chip 2.

As illustrated in FIG. 7, the space 4 forms between the substrate 1 and the semiconductor chip 2. In addition, the gap 7 forms between the power supplying device 5 and the substrate 1, so that the power supplying device 5 is not fixed to the substrate 1. Although not shown, it is possible that the power supplying device 5 is fixed to the substrate 1 except at the portion of the power supplying device 5 interposed between the semiconductor chip 2 and the substrate 1.

Further, at least one of the surfaces of the power supplying device 5 and the substrate 1 facing the gap 7 may have a property such that a contact angle of at least one of the surfaces of the power supplying device 5 and the substrate 1 facing the gap 7 relative to the sealing member 33 is greater than a contact angle of a part of the surface of the substrate 1 not facing the gap 7 relative to the sealing member 33. In this condition, the sealing member 33 used as an adhesive material does not enter the gap 7 formed between the power supplying device 5 and the substrate 1, so that the power supplying device 5 is not fixed to the substrate 1. Thereby, the expansion and contraction of the substrate 1 caused by heat are not transferred to the power supplying device 5. As a result, the breakage of an electrical conjunction portion may be prevented.

However, when using the adhesive material of, the sealing member 33 whose contact angle relative to the substrate 1 is very small (i.e., an easy-flow adhesive material), the adhesive material of the sealing member 33 tends to enter the gap 7 even though the contact angle of at least one of the surfaces of the power supplying device 5 and the substrate 1 facing the gap 7 relative to the sealing member 33 is substantially large. In this case, the contact angle of at least one of the surfaces of the power supplying device 5 and the substrate 1 facing the gap 7 relative to the sealing member 33 should be greatly increased (i.e., an adhesive material repelling effect should be enhanced) to prevent the sealing member 33 from entering the gap 7.

As illustrated in FIG. 8, the sealing member 33 is disposed in a direction perpendicular to the sheet of FIG. 8 with the adhesive material 3 sandwiched between the sealing member 33. The space 4 formed between the substrate 1 and the semiconductor chip 2, and the adhesive materials does not exist in the space 4.

The semiconductor chip 2 includes the functional surface 2a, the back surface 2b disposed opposite to the functional surface 2a, and the side surfaces 2c. Although not shown, the surface of the adhesive material used as the sealing member 33 is coated with a cured adhesive material. However, a part of the coating of the cured adhesive material is split at a position where the surface of the sealing member 33 adheres to the side surfaces 2c of the semiconductor chip 2 and the substrate 1. The sealing member 33 adheres to the side surfaces 2c and the substrate 1 to seal the functional surface 2a of the semiconductor chip 2. By coating the sealing member 33 with a cured adhesive material, even though an adhesive material having low viscosity is used for the sealing member 33, the adhesive material does not flow into the space between the functional surface 2a of the semiconductor chip 2 and the substrate 1.

The sealing member 33 has a cross-section of a circular shape to provide resistance to the inside/outside pressure exerted on the sealing member 33. The circular shape has as one advantage, ease of production of the sealing member 33. If the sealing member 33 has a polygonal-shaped cross-section, the contact area of the sealing member 33 with the side surfaces 2c and substrate 1 increases, resulting in an advantage in sealing.

With regard to the curing of the surface of the sealing member 33, in the case of the hot cured adhesive material, the surface of the sealing member 33 is cured by heating. In the case of the UV cured adhesive material, the surface of the sealing member 33 is cured by short exposure to ultraviolet light. After the adhesive material having a cured surface is disposed at a predetermined position where the surface of the sealing member 33 adheres to the side surfaces 2c of the semiconductor chip 2 and the substrate 1, the adhesion cured surface of the adhesive material of the sealing member 33 is split by means of pressure, heating, or laser irradiation to take out a soft adhesive material.

Figure 9:
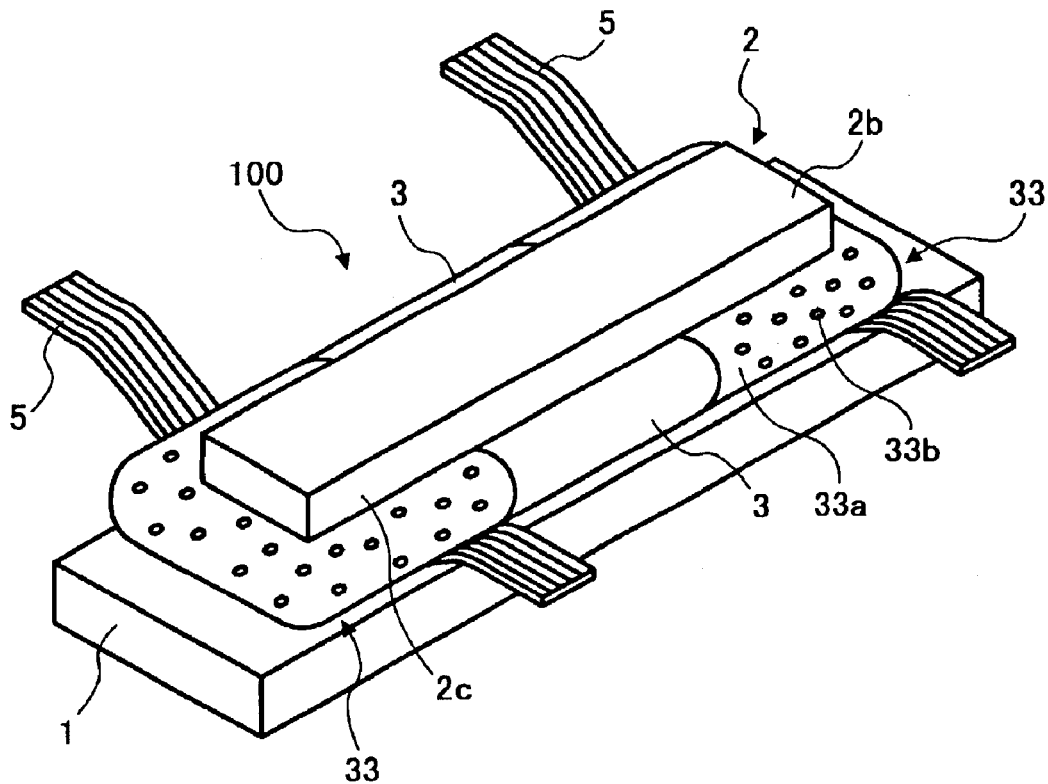
FIG. 9 is a perspective view of a semiconductor device including a sealing member having an adhesive material holding element and an adhesive material according to an alternative example.

As an alternative construction, as illustrated in FIG. 9, the sealing member 33 may include an adhesive material holding element 33a and an adhesive material 33b held by the adhesive material holding element 33a. In this construction, because the adhesive material 33b is held by the adhesive material holding element 33a, this prevents the adhesive material 33b from flowing into a space between the functional surface 2a of the semiconductor chip 2 and the substrate 1. For example, the adhesive material holding element 33a may be formed from a sponge material, an aggregated body of fibers, or a material having a sufficient holding force to not cause the adhesive material 33b to flow out. If the adhesive material holding element 33a has a light transparent property, the adhesive material of a photo-curing type may be used because a light can pass through the adhesive material holding element 33a.

Figure 10:
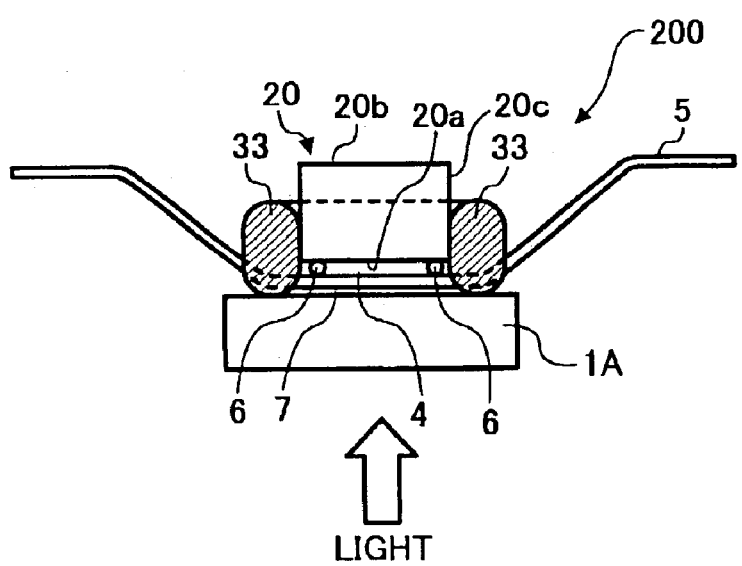
FIG. 10 is a cross-sectional view of a solid-state imaging apparatus corresponding to the cross-sectional view of the semiconductor device of FIG. 8 when a solid-state imaging device is used as an optical functional component in place of the semiconductor chips illustrated in FIGS. 7 and 8.

FIG. 10 is a cross-sectional view of a solid-state imaging apparatus corresponding to the cross-sectional view of the semiconductor device of FIG. 8 when a solid-state imaging device is used as an optical functional component in place of the semiconductor chips illustrated in FIGS. 7 and 8.

As illustrated in FIG. 10, a solid-state imaging apparatus 200 includes a light transparent substrate 1A formed from a transparent plate such as glass, plastic, and the like, and a solid-state imaging device 20 as an optical functional component. The solid-state imaging device 20 includes an optical functional surface 20a, a back surface 20b, and side surfaces 20c corresponding to the functional surface 2a, the back surface 2b, and the side surfaces 2c of the semiconductor chip 2 in FIG. 8, respectively. Similarly, as in the semiconductor device of FIG. 8, the side surfaces 20c and the light transparent substrate 1A are fixed through the adhesive material 3. In this case, the optical functional surface 20a is not covered by the adhesive material 3. Further, the sealing member 33 also adheres to the side surfaces 20c and the light transparent substrate 1A. The optical functional surface 20a is not covered by the sealing member 33 either. That is, neither the adhesive material 3 nor the sealing member 33 adheres to the optical functional surface 20a. In the solid-state imaging apparatus 200, a light incident space forms between the optical functional surface 20a and the light transparent substrate 1A. Due to the light incident space, the adhesive material does not interfere with a light path. In addition, the optical functional surface 20a of the solid-state imaging device 20 is protected from moisture and foreign substances by the adhesive material 3 and the sealing member 33. Therefore, the solid-state imaging device 20 can adequately function as an optical functional component without causing image deterioration.

Figure 11:
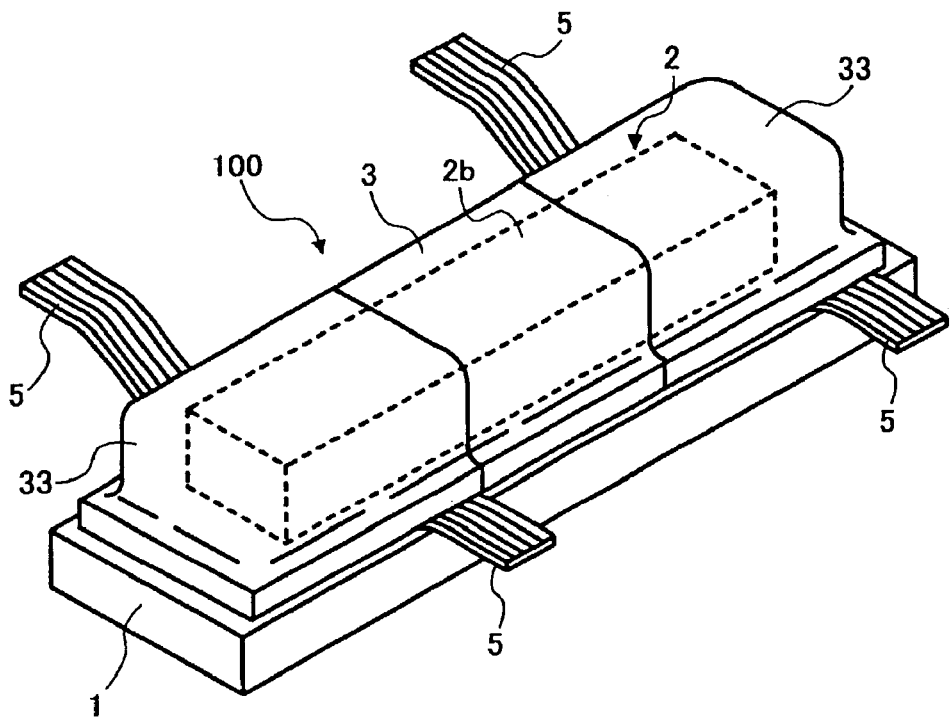
FIG. 11 is a perspective view of a semiconductor device according to the second embodiment of the present invention.

FIG. 11 is a perspective view of a semiconductor device according to a second embodiment of the present invention. As illustrated in FIG. 11, the assembly 100 is disposed on the substrate 1. The adhesive material 3 and the sealing member 33 adhere and seal the assembly 100 and the substrate 1 such that the adhesive material 3 and the sealing member 33 cover the back surface 2b of the semiconductor chip 2 and the surface of the substrate 1. In this embodiment, the adhesive material 3 and the sealing member 33 may use, for example, a film adhesive material and a film sealing member, respectively. As described above, as compared to the adhesive material 3, the sealing member 33 has greater elasticity. By use of the film adhesive material and film sealing member, the adhesive material does not contact the functional surface 2a of the semiconductor chip 2, thereby preventing a problem in which the adhesive material becomes an invisible electrical circuit and the semiconductor device cannot perform its desired function because the adhesive material works as a capacitor with a harmful parasitic capacitance. Further, when using the semiconductor chip as an optical device, another problem is avoided, in which the adhesive material moves to a light receiving surface or a light emitting surface of the optical device and blocks a light path.

The above-described adhesive material 3 and the sealing member 33 may be formed from photo-curing type adhesive materials, heat-curing type adhesive materials, or thermoplastic type adhesive materials. In the case of the photo-curing type adhesive materials, the semiconductor chip 2 and the substrate 1 adhere and fix without any discrepancy at the fixed portion caused by thermal expansion because the rise in temperature of the adhesive material 3 and the sealing member 33 would almost not occur when the adhesive materials are cured by light. Further, this does not produce residual stress due to temperature change. Moreover, because the adhesive material maintains its structural integrity in the face of small heat radiation, the adhesive material does not peel off caused by contraction when the adhesive material is cured. Therefore, the adhesive material can keep the functional surface of the semiconductor chip in an airtight condition after the adhesive material is cured.

The curing temperature of the heat-curing type adhesive materials is at most a temperature which does not break a junction between the power supplying device 5 and the semiconductor chip 2. In this condition, the adhesive material can be cured by the heat-curing type adhesive material even in the area which cannot be exposed to a curing light. In addition, the assembly 100 adhere to the substrate 1 without breaking the junction between the power supplying device 5 and the semiconductor chip 2.

The softening temperature of the thermoplastic type adhesive materials is at most a temperature which does not break a junction between the power supplying device 5 and the semiconductor chip 2. In this condition, the adhesive material can be cured by the thermoplastic type adhesive material even in the area which cannot be exposed to a curing light. In addition, the assembly 100 can adhere to the substrate 1 without breaking the junction between the power supplying device 5 and the semiconductor chip 2.

Figure 12:
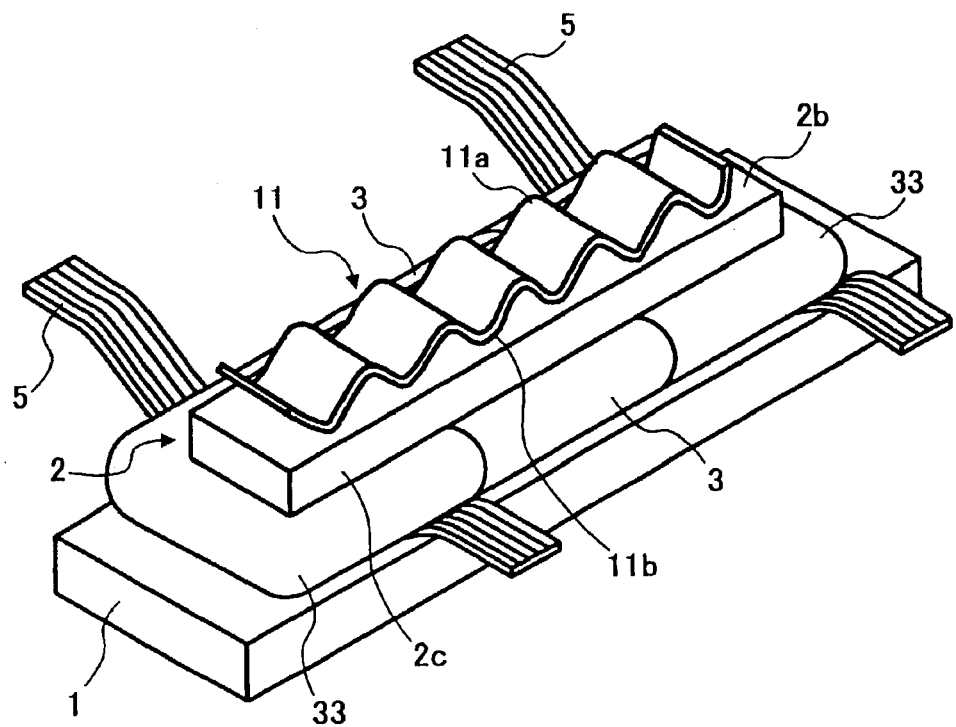
FIG. 12 is a perspective view of a semiconductor device according to the third embodiment of the present invention.

FIG. 12 is a perspective view of a semiconductor device according to a third embodiment of the present invention. The semiconductor device of FIG. 12 has a construction similar to the semiconductor device of FIG. 6 except for a heat radiating member 11.

As illustrated in FIG. 12, the heat radiating member 11 is formed in a wave shape in succession of a top 11a and a bottom 11b. The bottoms 11b adhere to the back surface 2b of the semiconductor chip 2 by an adhesive material or the like. Because the heat radiating member 11 of a wave shape is arranged on the semiconductor chip 2 along the longitudinal direction of the semiconductor chip 2, the heat radiating member 11 has an elastic property for expansion and contraction in the longitudinal direction of the semiconductor chip 2 caused by heat. Due to this arrangement, when the semiconductor chip 2 expands and contracts by heat, the heat radiating member 11 does not interfere with the expansion and contraction of the semiconductor chip 2. In addition, the expansion and the contraction of the heat radiating member 11 does not influence on the semiconductor chip 2. With the above-described construction, the semiconductor chip 2 and the substrate 1 are free from thermal stress other than that caused by themselves, and thereby the semiconductor chip 2 and the substrate 1 are not deformed by an external force.

Figure 13:
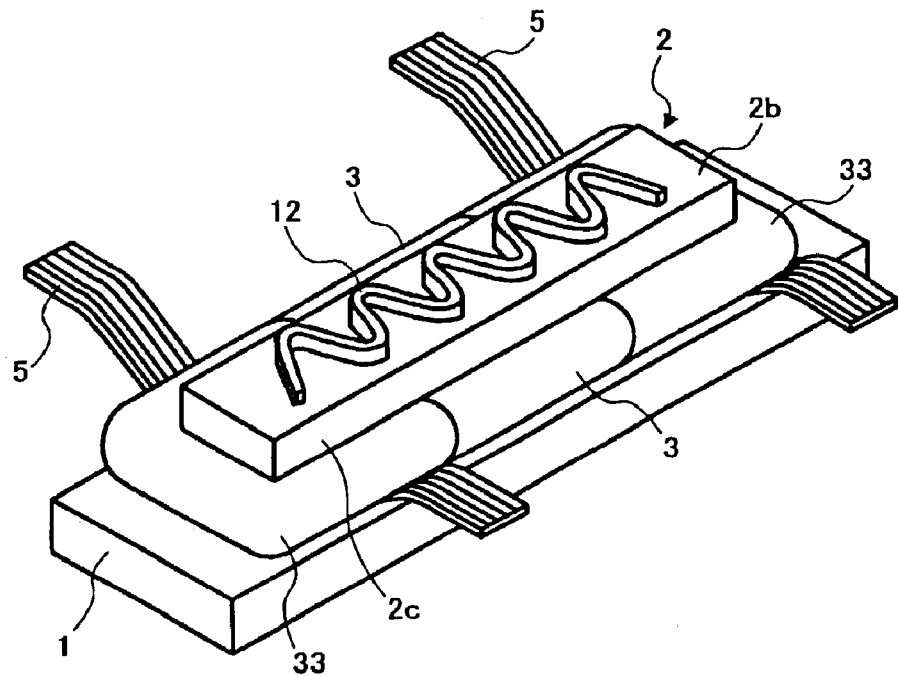
FIG. 13 is a perspective view of a semiconductor device including a heat radiating member according to an alternative example.

FIG. 13 is a perspective view of a semiconductor device including a heat radiating member according to an alternative example. The semiconductor device of FIG. 13 has a construction similar to the semiconductor device of FIG. 12 except for a heat radiating member 12.

As illustrated in FIG. 13, the heat radiating member 12 is oriented differently with respect to the back surface 2b than is the heat radiating member 11. As described above, the semiconductor chip 2 expands and contracts by heat in the longitudinal direction thereof. However, because the heat radiating member 12 has an elastic property in the longitudinal direction of the semiconductor chip 2, the heat radiating member 12 in FIG. 13 has similar effects to those of the heat radiating member 11 in FIG. 12.

Figure 14:
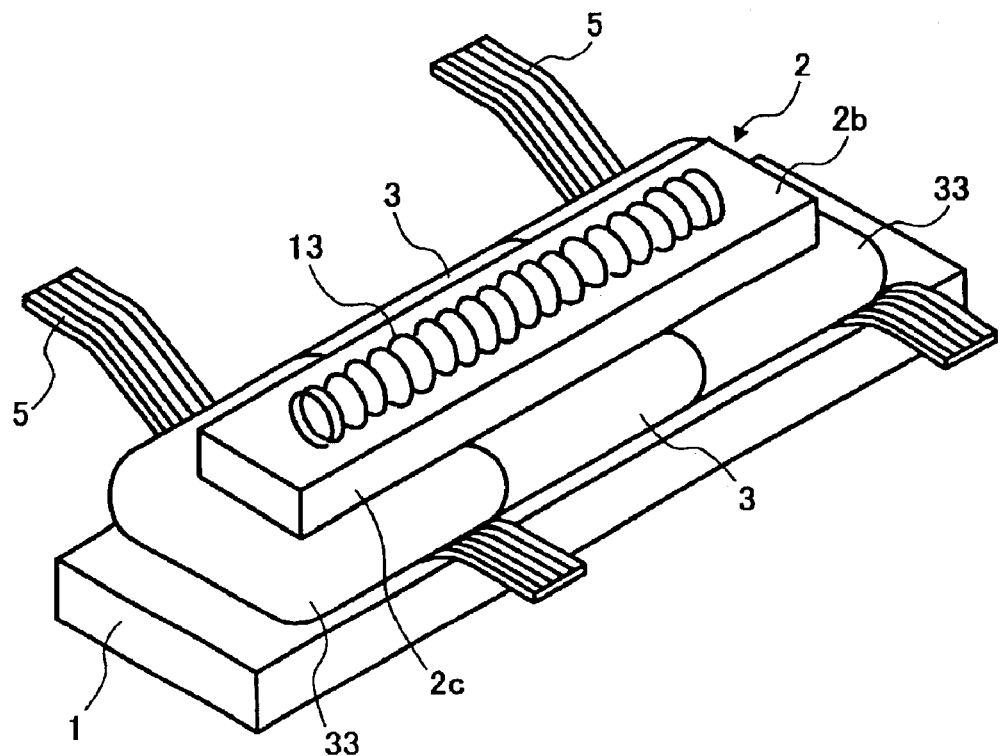
FIG. 14 is a perspective view of a semiconductor device including a heat radiating member according to another alternative example.

FIG. 14 is a perspective view of a semiconductor device including a heat radiating member according to another alternative example. The semiconductor device of FIG. 14 has a construction similar to the semiconductor device of FIG. 12 except for a heat radiating member 13.

As illustrated in FIG. 14, the heat radiating member 13 forms into a spiral shape and attaches onto the back surface 2b of the semiconductor chip 2 with a center axis of the spiral being aligned along the longitudinal direction of the semiconductor chip 2. As described above, the semiconductor chip 2 expands and contracts by heat in the longitudinal direction thereof. However, because the heat radiating member 13 has an elastic property in the longitudinal direction of the semiconductor chip 2, the heat radiating member 13 in FIG. 14 has similar effects to those of the heat radiating member 11 in FIG. 12.

Figure 15:
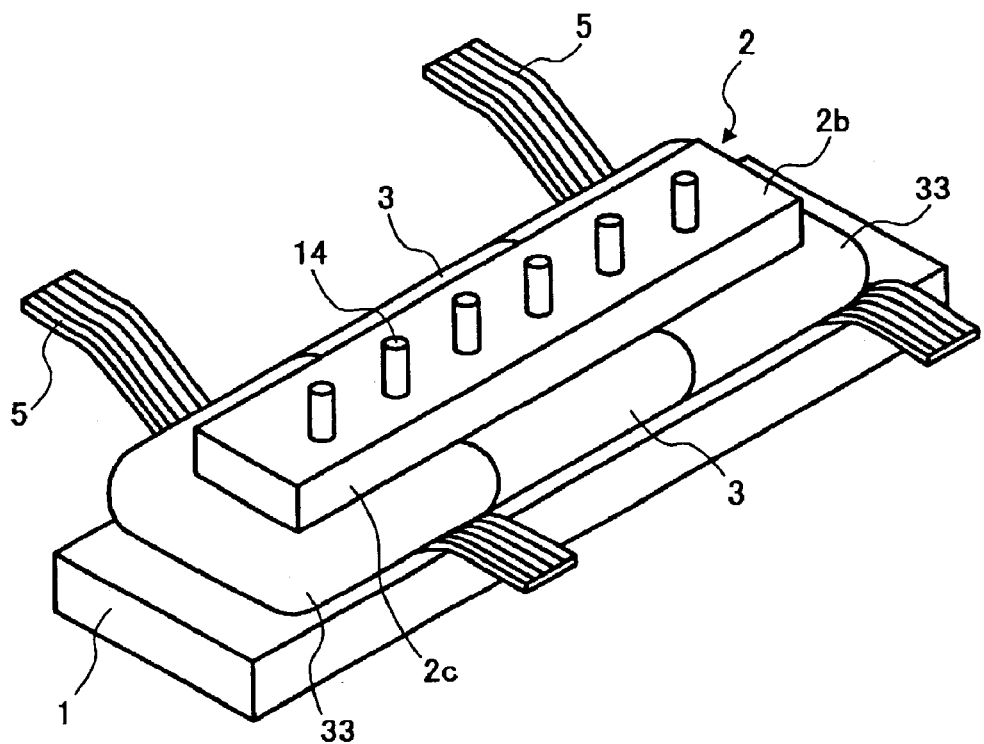
FIG. 15 is a perspective view of a semiconductor device including a heat radiating member according to another alternative example.

FIG. 15 is a perspective view of a semiconductor device including a heat radiating member according to another alternative example. The semiconductor device of FIG. 15 has a construction similar to the semiconductor device of FIG. 12 except for a heat radiating member 14.

The heat radiating device 14 forms into a line shape by a wire bonding apparatus which uses a thermal compression bonding method, an ultrasonic bonding method, and the like with cutting the wires in the middle of the process. As described above, the semiconductor chip 2 expands and contracts by heat in the longitudinal direction thereof. However, because the heat radiating member 14 has a smaller area in contact with the semiconductor chip 2 in the longitudinal direction of the semiconductor chip 2, the heat radiating member 14 does not interfere with the expansion and contraction of the semiconductor chip 2, when the semiconductor chip 2 expands and contracts by heat. In addition, the expansion and the contraction of the heat radiating member 14 does not influence the semiconductor chip 2. With the above-described construction, the semiconductor chip 2 and the substrate 1 are free from thermal stress except that caused by themselves, and thereby the semiconductor chip 2 and the substrate 1 are not deformed by an external force.

Figure 16:
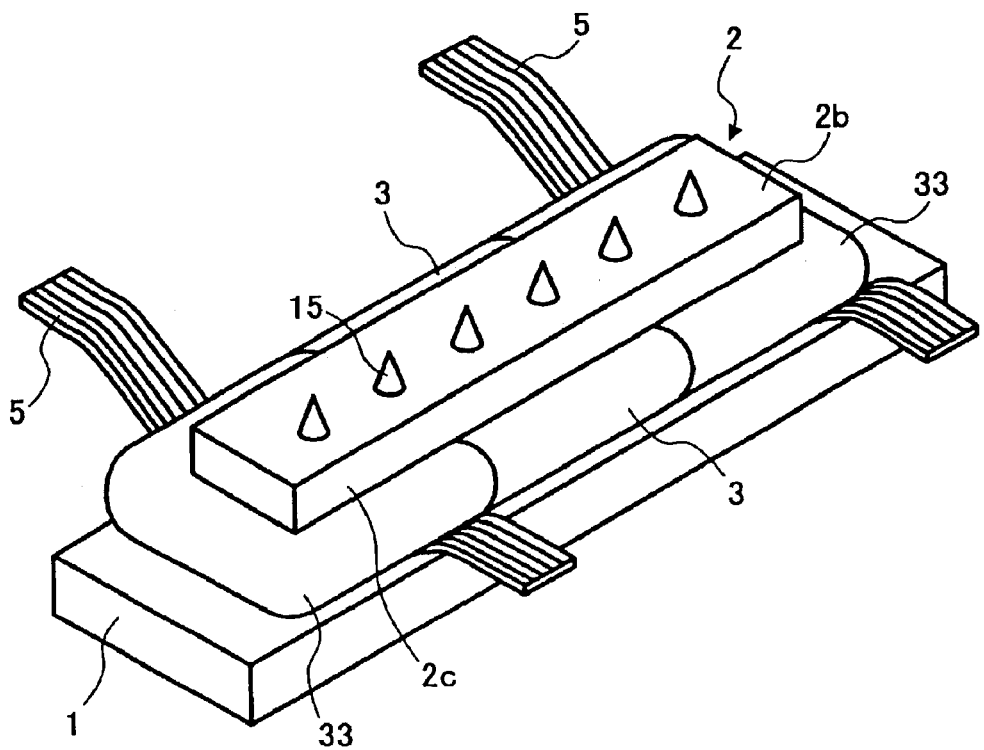
FIG. 16 is a perspective view of a semiconductor device including a heat radiating member according to another alternative example.

FIG. 16 is a perspective view of a semiconductor device including a heat radiating member according to another alternative example. The semiconductor device of FIG. 16 has a similar construction to the semiconductor device of FIG. 12 except for a heat radiating member 15.

The heat radiating member 15 forms into a cone shape by a wire bonding apparatus which uses a thermal compression bonding method, an ultrasonic bonding method, and the like with cutting the wires in the middle of the process. The heat radiating member of a cone shape, which is made when a solder is wire bonded, has a heat radiating effect.

As described above, the semiconductor chip 2 expands and contracts by heat in the longitudinal direction thereof. However, because the heat radiating member 15 has a smaller area in contact with the semiconductor chip 2 in the longitudinal direction of the semiconductor chip 2, the heat radiating member 15 does not interfere with the expansion and contraction of the semiconductor chip 2, when the semiconductor chip 2 expands and contracts by heat. In addition, the heat radiating member 15 does not give stress to the semiconductor chip 2 by the deformation of the heat radiating member 15.

Figure 17:
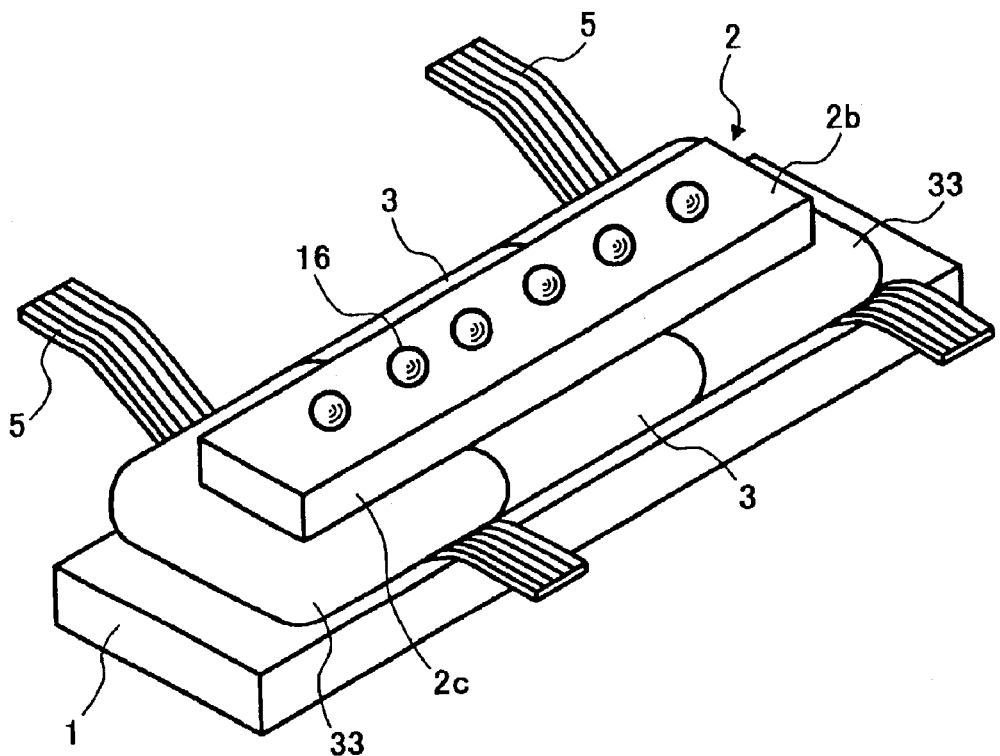
FIG. 17 is a perspective view of a semiconductor device including a heat radiating member according to another alternative example.

FIG. 17 is a perspective view of a semiconductor device including a heat radiating member according to another alternative example. The semiconductor device of FIG. 17 has a construction similar to the semiconductor device of FIG. 12 except for a heat radiating member 16.

The heat radiating member 16 is formed in a spherical shape. The heat radiating member 16 in a spherical shape, which is made when a solder is melted to become spherical and put on the semiconductor chip 2 to adhere, has a heat radiating effect as well.

As described above, the semiconductor chip 2 expands and contracts by heat in the longitudinal direction thereof. However, because the heat radiating member 16 has a smaller area in contact with the semiconductor chip 2 in the longitudinal direction of the semiconductor chip 2, the heat radiating member 16 does not interfere with the expansion and contraction of the semiconductor chip 2, when the semiconductor chip 2 expands and contracts by heat. In addition, the heat radiating member 16 does not give stress to the semiconductor chip 2 by the deformation of the heat radiating member 16.

Figure 18:
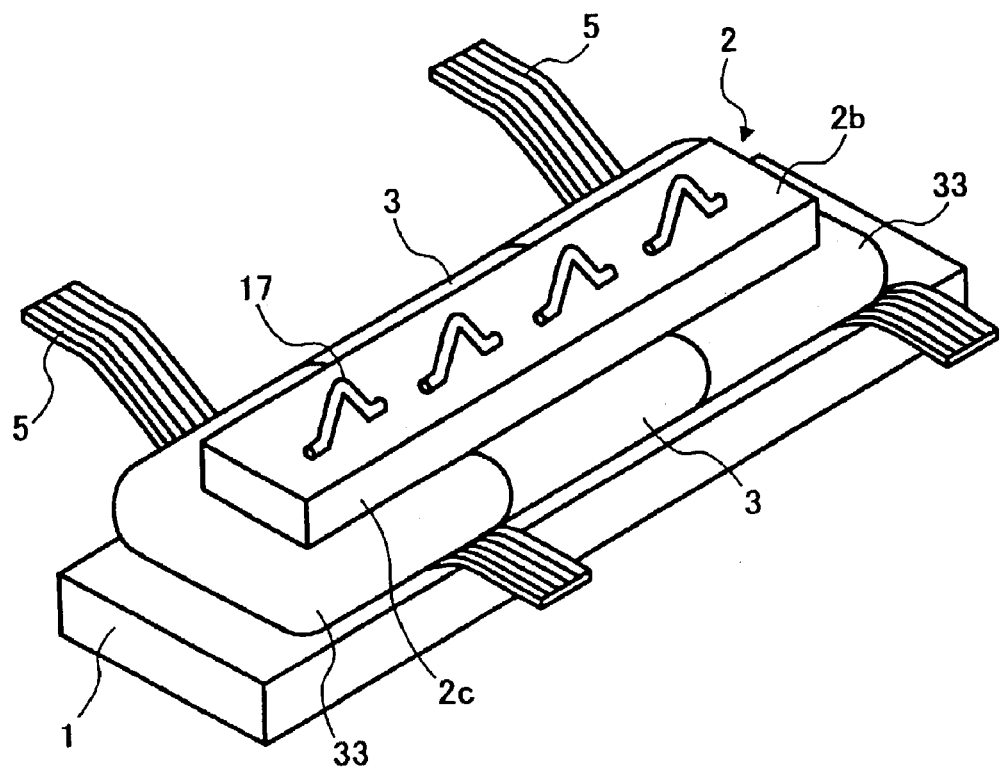
FIG. 18 is a perspective view of a semiconductor device including a heat radiating member according to another alternative example.

FIG. 18 is a perspective view of a semiconductor device including a heat radiating member according to another alternative example. As illustrated in FIG. 18, the semiconductor device of FIG. 18 includes a heat radiating member 17 in a line shape as an alternative to the heat radiating member 14 in a line shape in the semiconductor device of FIG. 15. When it is difficult to make the heat radiating member 14 stand straight by the wire bonding apparatus in FIG. 15, it may be arranged so that a plurality of wires are put on the back surface 2b of the semiconductor chip 2 to be contact bonded at two points of each wire as illustrated in FIG. 18. The heat radiating member 17 is formed, for example, in a shape of inverted V. The heat radiating member 17 has similar effects to those of the heat radiating member 14 in FIG. 15.

Figure 19:
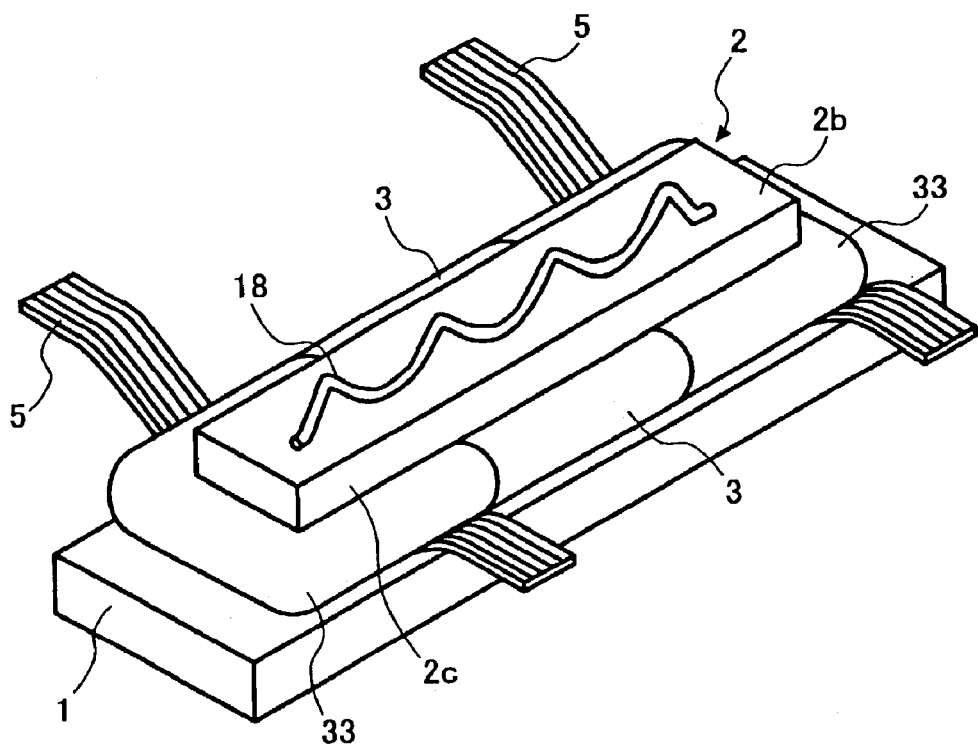
FIG. 19 is a perspective view of a semiconductor device including a heat radiating member according to another alternative example.

FIG. 19 is a perspective view of a semiconductor device including a heat radiating member according to another alternative example. As illustrated in FIG. 19, the semiconductor device of FIG. 19 includes a heat radiating member 18 in a line shape as an alternative to the heat radiating member 14 in a line shape in the semiconductor device of FIG. 15. When it is difficult to make the heat radiating member 14 stand straight by the wire bonding apparatus in FIG. 15, it may be arranged so that a bent wire is put on the back surface 2b of the semiconductor chip 2 to be contact bonded at a plurality of points of the wire as illustrated in FIG. 19. The heat radiating member 18 is formed, for example, in a bent line shape in which a plurality of inverted V shape lines are continuously formed. The heat radiating member 18 has similar effects to those of the heat radiating member 17 in FIG. 18.

The heat radiating members 11 through 18 illustrated in FIGS. 12 through 19 are preferably formed from a material having high thermal conductivity such as metal and may be bonded to the semiconductor chip 2 by adhesion or contact bonding. The heat radiating members 14 through 18 illustrated in FIGS. 15 through 19 may be bonded to the semiconductor chip 2 with the wire bonding apparatus. In this case, the heat radiating members 14 through 18 preferably have each shape illustrated in FIGS. 15 through 19.

Figure 20:
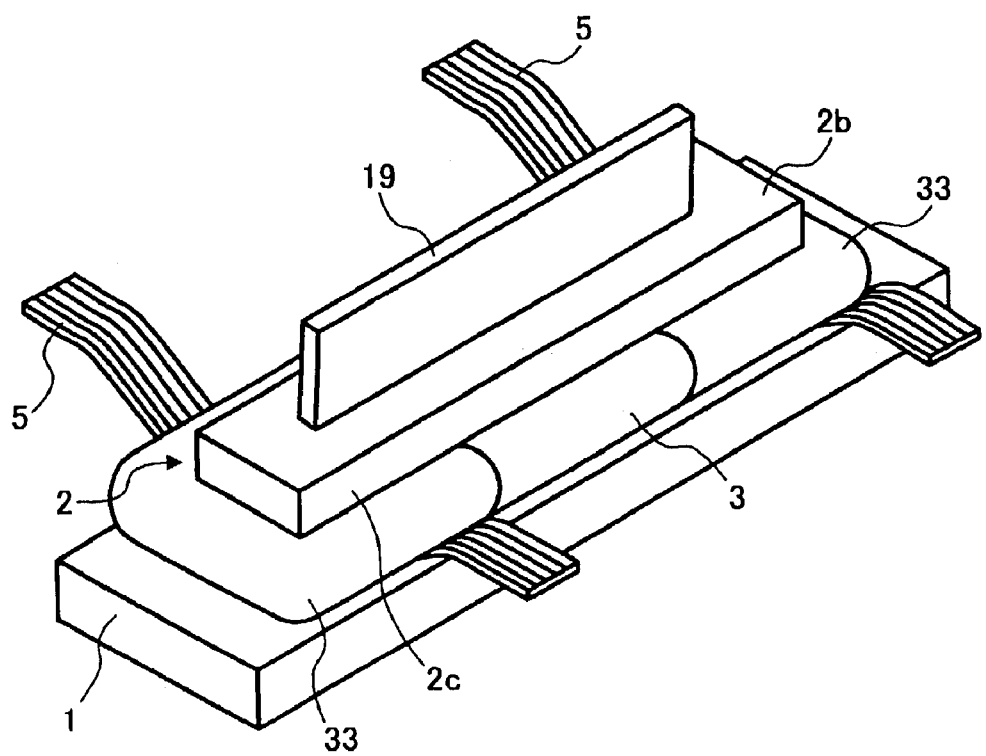
FIG. 20 is a perspective view of a semiconductor device including a heat radiating member according to another alternative example.

FIG. 20 is a perspective view of a semiconductor device including a heat radiating member according to another alternative example. The semiconductor device of FIG. 20 has a similar construction to the semiconductor device of FIG. 12 except for a heat radiating member 19.

The heat radiating member 19 is formed into a shape of a plate and disposed to stand on the back surface 2b of the semiconductor chip 2. The heat radiating member 19 is formed from a material having a thermal expansion coefficient close to that of the semiconductor chip 2. Because the heat radiating member 19 having the thermal expansion coefficient close to that of the semiconductor chip 2 is arranged along the longitudinal direction of the semiconductor chip 2, the heat radiating member 19 expands and contracts similarly corresponding to the expansion and contraction of the semiconductor chip 2 along the longitudinal direction thereof caused by heat. Therefore, the heat radiating member 19 does not interfere with the expansion and contraction of the semiconductor chip 2. In addition, the expansion and contraction of the heat radiating member 19 does not have influence on the semiconductor chip 2. With the above-described construction, the semiconductor chip 2 and the substrate 1 are free from thermal stress other than that caused by themselves, and thereby the semiconductor chip 2 and the substrate 1 are not deformed by an external force. Therefore, the heat radiating member 19 can enhance heat radiating effects thereof without giving stress to the semiconductor chip 2.

In the semiconductor device of FIG. 20, the heat radiating member 19 is disposed such that the heat radiating member 19 extends in the longitudinal direction of the semiconductor chip 2. Alternatively, the heat radiating member 19 may be disposed, for example, such that the heat radiating member 19 extends in the direction perpendicular to the longitudinal direction of the semiconductor chip 2, or such that the heat radiating member 19 extends in the direction in substantially parallel to the diagonal line of the back surface 2b of the semiconductor chip 2.

The above-described heat radiating members 11 through 19 may be adequately constructed otherwise in consideration of a heat radiating amount of the semiconductor chip 2 and heat radiating effects of the heat radiating member. For example, the surface area of the heat radiating member may be increased. Further, each number of the heat radiating members 11 through 19 provided on the semiconductor chip 2 may be single or plural. With the provision of the heat radiating members 11 through 19, the heat of the semiconductor chip 2 can be efficiently radiated, and thereby the deformation of the semiconductor chip 2 due to heat can be restrained. Further, by reducing the deformation of the semiconductor chip 2, this prevents the adhesive material from peeling off. Therefore, the adhesive material can keep the functional surface of the semiconductor chip in an airtight condition.

Figure 21:
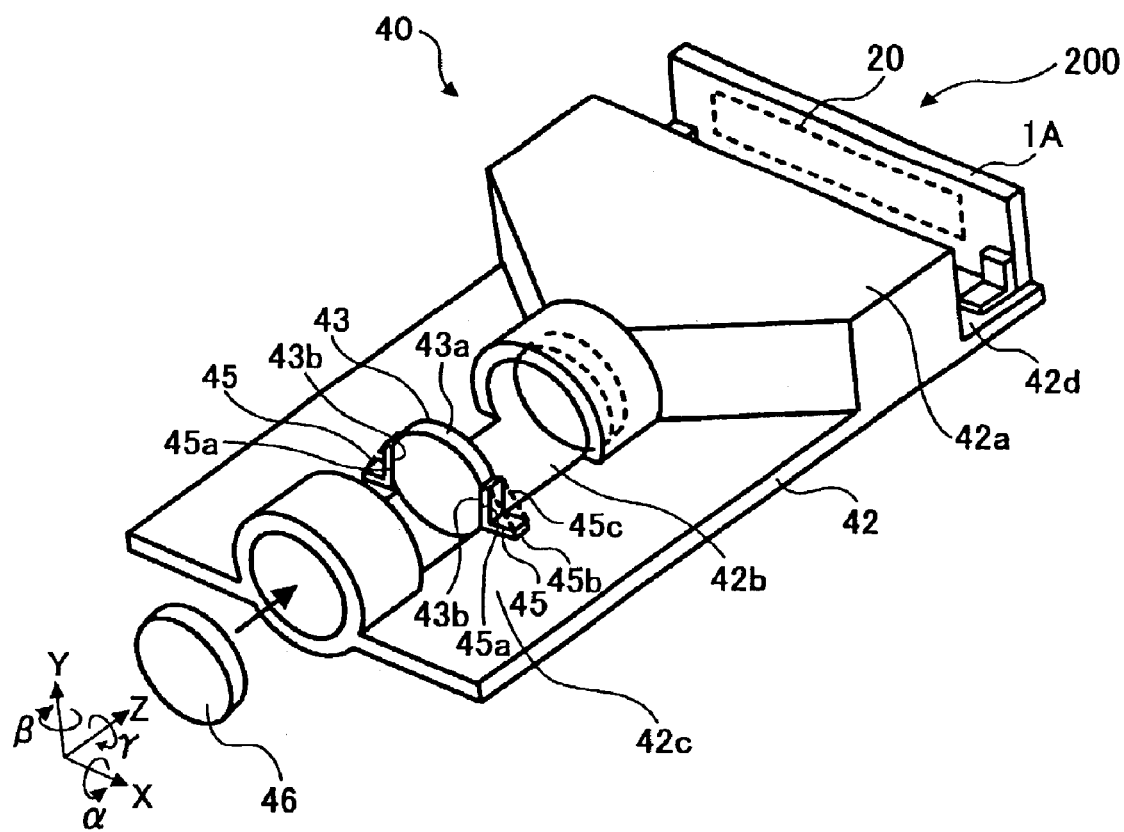
FIG. 21 is a perspective view of an image scanning unit using a solid-state imaging apparatus as a semiconductor device according to an embodiment of the present invention.

FIG. 21 is a perspective view of an image scanning unit using a solid-state imaging apparatus constructed with the semiconductor chip according to the embodiment of the present invention.

As illustrated in FIG. 21, the image scanning unit 40 using the above-described solid-state imaging apparatus 200 includes a lens 43 as an optical element, a housing 42 serving as a base member, and an intermediate holding member 45 connected between the lens 43 and the housing 42. Specifically, the lens 43 includes a light-transmitting surface through which a light reflected from the surface of an original document passes, and an edge surface 43a as a side edge of the lens provided around the circumferential surface of the light-transmitting surface. The intermediate holding member 45 includes a first attaching surface 45a facing the edge surface 43a of the lens 43, and a second attaching surface 45b which is disposed at a different angle, for example, about 90 degrees in this embodiment, with respect to the first attaching surface 45a. The housing 42 includes an attaching surface 42c facing the second attaching surface 45b of the intermediate holding member 45. In the image scanning unit 40, the housing 42, and the lens 43, whose position is adjusted relative to the housing 42, adhere and are fixed to each other via the intermediate holding member 45.

The lens 43 further includes two flat surfaces 43b which are arranged in the same diameter on the edge surface 43a. The flat surfaces 43b are formed by a cutting process or a grinding process, and rubbed if necessary. By forming the flat surfaces 43b, the contact area of the first attaching surface 45a of the intermediate holding member 45 and the lens 43 can be increased. As a result, a fixing strength of the first attaching surface 45a of the intermediate holding member 45 to the lens 43 can be enhanced.

The housing 42 is arranged to fix the lens 43 and the solid-state imaging apparatus 200 in an adjusted position after the positions of the lens 43 and the solid-state imaging apparatus 200 are adjusted to each other. The housing 42 includes a circular groove portion 42b, a flat attaching surface 42c adjoining the circular groove portion 42b, an attaching surface 42d to which the solid-state imaging apparatus 200 is attached, and a light shielding cover 42a disposed between an imaging lens system including the lens 43 and 46 and the solid-state imaging apparatus 200 to shield the imaging lens system and the solid-state imaging apparatus 200 from light. With provision of the light shielding cover 42a, a good quality image can be obtained while preventing the disturbance of an outside light. The housing 42 of the image scanning unit is fixed at a predetermined position in an image forming apparatus (described below), such as a copying machine, by fixing devices of screwing, caulking, adhering, welding, and so on.

The intermediate holding member 45 is made of a material having a high light (ultraviolet) transmittance, for example, ARTON (trademark manufactured by JSR Corporation), Zeonex (trademark manufactured by Zeon Corporation), polycarbonate, and so on.

When the position of the lens 43 is moved for positional adjustment of the lens 43, the intermediate holding member 45 slidably moves at both of the adhering surfaces by the surface tension of the adhesive material and follows the movement of the lens 43.

By arranging the first attaching surface 45a and the second attaching surface 45b of the intermediate holding member 45 at right angles to each other, the positional adjustment of the lens 43 becomes possible in six axes and along respective adjustment axes, and the adjustment can be independently performed.

By arranging the two flat surfaces 43b serving as adhering surfaces formed at the edge surface 43a of the lens 43 opposite to each other by use of the two intermediate holding members 45, this reduces the influence of shrinkage when the adhesive material is cured.

Further, by arranging a light transparent rib 45c between the both adhering surfaces of the intermediate holding member 45, the strength of the intermediate holding member 45 can be increased without increasing a loss of light when the photo-curing type adhesive material is cured.

Because the first attaching surface 45a as a fixing surface for the lens and the second attaching surface 45b as a fixing surface for the holding member side are arranged at right angles to each other, the positional adjustment can be independently performed in respective X, Y, Z, α, β, and γ adjusting directions of the lens 43.

When considering a case in which the intermediate holding member 45 is connected and fixed with the lens 43 and the housing 42 by the ultraviolet-curing type adhesive material, the lens 43 and the intermediate holding member 45 have the positional adjustment with a sliding movement on a housing attaching surface 42c as a fixing surface for the holding member side of the housing 42 when they are adjusted along the X and Z directions.

When the lens 43 and the intermediate holding member 45 are adjusted along the Y direction, the lens 43 has the positional adjustment with a sliding movement on the first attaching surface 45a as a fixing surface for the lens.

Further, the lens 43 and the intermediate holding member 45 are adjusted along the α, β, and γ in the similar manner. Because the optical element has a spherical shape having the optical axis at its center when the optical element is lens, any discrepancy in the optical axis which is caused by an error during the manufacturing process cannot be adjusted by rotation around the optical axis (γ axis) and it is merely rotated. Therefore, the adjustment around the γ axis is not required.

Figure 22:
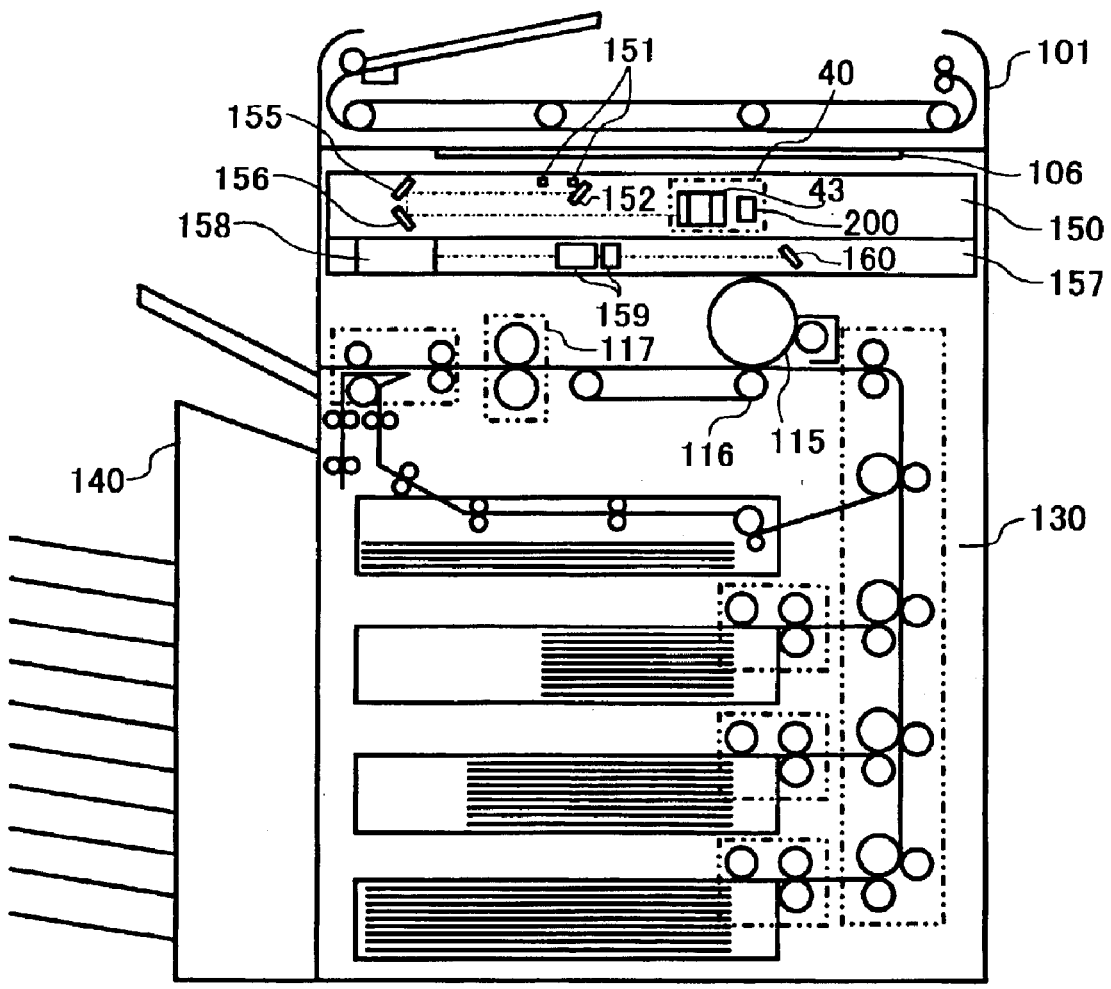
FIG. 22 is a schematic view of a multi-function type digital image forming apparatus including the image scanning unit of FIG. 21 according to an embodiment of the present invention.

FIG. 22 is a schematic view of a multi-function type digital image forming apparatus including an image scanning unit using a solid-state imaging apparatus as a semiconductor device according to an embodiment of the present invention.

As illustrated in FIG. 22, the image forming apparatus including the image scanning unit 40 includes an auto document feeder 101, an image reading device 150, an image writing unit 157, a sheet feeding unit 130, and a post-processing unit 140. The auto document feeder 101 automatically feeds an original document onto a contact glass 106 of the image reading device 150, and automatically discharges the original document after an image of the original document is read.

The image reading device 150 illuminates the original document set on the contact glass 106 and reads the optical information by the solid-state imaging apparatus 200 serving as a photoelectric transfer device. The image writing unit 157 forms an electrostatic latent image on a photoreceptor 115 functioning as an image carrier in accordance with the image signals obtained by reading the original document. The image is transferred from the photoreceptor 115 to a transfer sheet fed from the sheet feeding unit 130 by a transfer device 116. The transferred image is fixed to the transfer sheet in a fixing device 117. The transfer sheet having a fixed image is conveyed to the post-processing unit 140, and required post-processing operations such as sorting or stapling are performed.

The image reading device 150 includes the contact glass 106 on which an original document is set, and an optical scanning system. The optical scanning system includes an exposure lamp 151, a first mirror 152, the lens 43, the solid-state imaging apparatus 200, a second mirror 155, and a third mirror 156. The exposure lamp 151 and the first mirror 152 are fixed onto a first carriage (not shown). The second mirror 155 and the third mirror 156 are fixed onto a second carriage (not shown). When reading an image of an original document, the first and second carriages are moved mechanically at a relative speed ratio of two to one so as not to change a length of the light path. The optical scanning system is driven by a scanner driving motor (not shown).

The image of the original document is read by the solid-state imaging apparatus 200, and optical signals of the image data are transformed into electrical signals to be processed. When the lens 43 and the solid-state imaging apparatus 200 are moved in the left and right direction in FIG. 22, the magnification rate of the image is changed. Specifically, the position of the lens 43 and the solid-state imaging apparatus 200 in the left and right direction is set in accordance with a predetermined magnification rate.

The image writing unit 157 includes a laser output unit 158, an image focusing lens 159, and a mirror 160. In the laser output unit 158, laser diodes functioning as a laser light source and a polygonal mirror that is rotated by a motor at a high and constant speed are provided.

The laser light beam irradiated from the laser output unit 158 is deflected by the polygonal mirror, and passes through the image focusing lens 159, and is reflected by the mirror 160 to be focused on the surface of the photoreceptor 115. The deflected laser light beam makes a scan of the surface of the photoreceptor 115 in a direction perpendicular to the rotating direction of the photoreceptor 115, that is, a so-called main scanning direction. By repeating the main scanning in a predetermined period which corresponds to a rotation speed and a recording density of the photoreceptor 115, an electrostatic latent image is formed on the surface of the photoreceptor 115.

As described above, the laser light beam output from the image writing unit 157 is irradiated to the surface of the photoreceptor 115 of an image forming system. A beam sensor (not shown) that generates a synchronizing signal is disposed at the irradiated area adjacent to the one end of the photoreceptor 115. The signal output from the beam sensor is a main scanning synchronizing signal. The control of recording timing for image data and generation of control signals for input/output of the image data signal are performed based on the main scanning synchronizing signal output from the beam sensor.

Hereinafter, a specific description will be made of the semiconductor device referring to FIGS. 5 through 8.

In the semiconductor device of FIGS. 5 through 8, the substrate 1 is a ceramic substrate, the semiconductor chip 2 is a silicon substrate on which an arithmetic circuit is formed, and the power supplying device 5 is a flexible substrate. The arithmetic circuit and the flexible substrate are bonded by a face down bonding method. The assembly of the arithmetic circuit and the flexible substrate is adhered onto the ceramic substrate. The drive power supply, and input and output signals are connected to the outside through the flexible substrate.

When the temperature around the device rises under the influence of environment condition or driving heat at the arithmetic circuit, the silicon substrate on which the arithmetic circuit is formed and the ceramic substrate start to expand based on respective thermal expansion coefficients. At this time, due to the difference in thermal expansion coefficient between the silicon substrate and the ceramic substrate, the amounts of expansion of the silicon substrate and the ceramic substrate are different from each other.

It is said that each thermal expansion coefficient of ceramic and silicon is similar to each other, and the ceramic and silicon are not likely to be influenced by thermal expansion. However, when the dimension of the silicon substrate becomes large, a small difference of the thermal expansion coefficient may cause great influence as a large difference in an entire amount of expansion.

Generally, as compared to silicon, ceramic has a high thermal expansion coefficient and a large amount of expansion. When the conjunction portion between the arithmetic circuit and the flexible substrate is fixed on the ceramic substrate, the conjunction portion is drown out by the expansion of the ceramic, resulting in breakage of the conjunction portion. However, in this embodiment, the conjunction portion between the arithmetic circuit and the flexible substrate is not fixed on the ceramic substrate. Therefore, the stress caused by thermal expansion of the ceramic substrate is not given to the conjunction portion. As a result, the breakage of the conjunction portion is prevented.

For the above reasons, it is not necessary to equalize the thermal expansion coefficient of the substrate 1 with that of the semiconductor chip 2. Therefore, in the embodiment, the material of the substrate 1 may be molded plastic, metal, ceramic, or the like.

Next, a specific description will be made of the solid-state imaging apparatus 200 referring to FIG. 10. In the solid-state imaging apparatus 200 of FIG. 10, the light transparent substrate 1A is a glass substrate, the solid-state imaging device 20 is a silicon substrate on which a line CCD is formed, and the power supplying device 5 is a flexible substrate. The line CCD and the flexible substrate are bonded by a facedown bonding method. The assembly of the line CCD and the flexible substrate is adhered onto the glass substrate. An incident light reaches the line CCD through the glass substrate, and electrical signals obtained by photoelectric conversion are output through the flexible substrate. The glass substrate of the substrate 1A functions as not only a protection member for the light receiving surface of the line CCD of the solid-state imaging device 20 but also a holding member for the line CCD.

When the temperature around the device rises under the influence of environment condition or driving heat at the line CCD, the silicon substrate on which the line CCD is formed and the glass substrate start to expand based on respective thermal expansion coefficients. At this time, due to the difference in thermal expansion coefficient between the silicon substrate and the glass substrate, the amounts of expansion of the silicon substrate and the glass substrate are different from each other.

Generally, as compared to silicon, glass has a high thermal expansion coefficient and a large amount of expansion. When the conjunction portion between the line CCD and the flexible substrate is fixed on the glass substrate, the conjunction portion is drown out by the expansion of the glass, resulting in breakage of the conjunction portion. However, in the embodiment, the conjunction portion between the line CCD and the flexible substrate is not fixed on the glass substrate. Therefore, the stress caused by thermal expansion of the glass substrate is not given to the conjunction portion. As a result, this prevents the breakage of the conjunction portion.

In the above-described embodiment, glass is used as the substrate 1A. In place of glass, other materials such as plastics, sapphire, and the like can be used so long as the material has a transparent property and satisfies an optical characteristic required by the CCD.

In the above-described semiconductor device of FIGS. 5 through 8 and the solid-state imaging apparatus 200 of FIG. 10, a flexible substrate is used as the power supplying device 5. However, in place of the flexible substrate, a hard power supplying device such as a printed circuit board can be used. In addition, it is preferable that the power supplying device 5 has a minimum length required for electrical conjunction in the longitudinal direction of the semiconductor chip 2 (or the solid-state imaging device 20). Especially when the semiconductor chip 2 (or the solid-state imaging device 20) is a line CCD having a relatively long length, and if the power supplying device 5 having much longer length is fixed with the semiconductor chip 2 (for example, two power supplying devices 5 illustrated in FIG. 3 are integrated into one body), the difference in amounts of thermal expansion between the semiconductor chip 2 and the power supplying device 5 seriously causes the breakage of the conjunction portion. This problem is caused depending on the rigidity of the power supplying device 5. Specifically, such a breakage tends to occur when the hard power supplying device such as a printed circuit board is used in place of the flexible substrate. For the above-described reasons, the power supplying device 5 preferably has a minimum length required for electrical conjunction in the longitudinal direction of the semiconductor chip 2 (or the solid-state imaging device 20).

As described above, a slight gap 7 is formed between the power supplying device 5 and the substrate 1 (or the substrate 1A), so that the power supplying device 5 is not fixed on the substrate 1. However, a portion of the power supplying device 5 other than the portion where the power supplying device 5 is sandwiched between the semiconductor chip 2 and the substrate 1 may be fixed to the substrate 1.

In the above-described embodiment, the semiconductor chip 2 (or the solid-state imaging device 20) and the power supplying device 5 are bonded by a flip chip bonding method. As non-limiting alternatives, the semiconductor chip 2 and the power supplying device 5 may be bonded by a beam lead bonding method or a tape automated bonding method.

Further, the shape of the semiconductor chip 2 is not limited to an elongated shape like the line CCD, but any other shapes such as a square, a polygon, a circle, as non-limiting examples, can be employed.

With regard to the adhesion by the adhesive material 3, when the semiconductor chip 2 has a long length like the line CCD, and when the adhering portion of the adhesive material 3 is wide and large, a circuit in the semiconductor chip 2 may be broken because of expansion and contraction of the substrate 1 even though the conjunction portion between the power supplying device 5 and the semiconductor chip 2 is not broken. In order to prevent the breakage of the circuit in the semiconductor chip 2, it may be preferable that the adhesive material 3 is put only at an area adjacent to the central portion of the semiconductor chip 2. Further, it may be preferable that a softer adhesive material 3 is used so as not to transfer the expansion and contraction of the substrate 1 to the semiconductor chip 2.

In the above-described embodiment, when the adhesive material 3 is provided close to the power supplying device 5, if the power supplying device 5 is adhered to the substrate 1 through the adhesive material 3, the expansion and contraction of the substrate 1 are transferred to the power supplying device 5 that is bonded to the semiconductor chip 2. Therefore, a space needs to be formed between the semiconductor chip 2 and the substrate 1 at a portion other than the adhesive material 3 functioning as the fixing member and other than the space 7 between the power supplying device 5 and the substrate 1. However, in this construction, air can pass through the space.

The functional surface of the semiconductor chip includes a protection film called a passivation film. Because the film is made of resin, when the film is kept in a high humidity condition for a relatively long time, the film absorbs moisture, that may influence the functional surface of the semiconductor chip. In this case, an insulation film is formed at the conjunction portion of aluminium at the power distribution portion in the semiconductor chip, thereby stopping the flow of electricity. This results in a problem of decreasing the reliability of the semiconductor device. In order to solve this problem, air needs to be prevented from passing through the space by sealing the space.

In the above-described embodiments, the space where air passes through is sealed by the sealing member 33. With provision of the sealing member 33, the functional surface of the semiconductor chip can be protected from moisture and foreign substances. However, if the sealing member 33 makes the power supplying device 5 securely fixed to the substrate 1, the expansion and contraction of the substrate 1 are transferred to the power supplying device 5 that is bonded to the semiconductor chip 2. Therefore, in the present embodiments, the expansion and contraction of the substrate 1 are not transferred to the power supplying device 5 because the sealing member 33 has greater elasticity than that of the adhesive materials 3 serving as a fixing member that fixes the semiconductor chip 2 to the substrate 1, and the sealing member 33 is soft and deformable. As a result, the breakage of an electrical conjunction portion is prevented. As non-limiting examples, the sealing member 33 may include a soft adhesive material, or a deformable foaming material having hermeticity.

Figure 23:
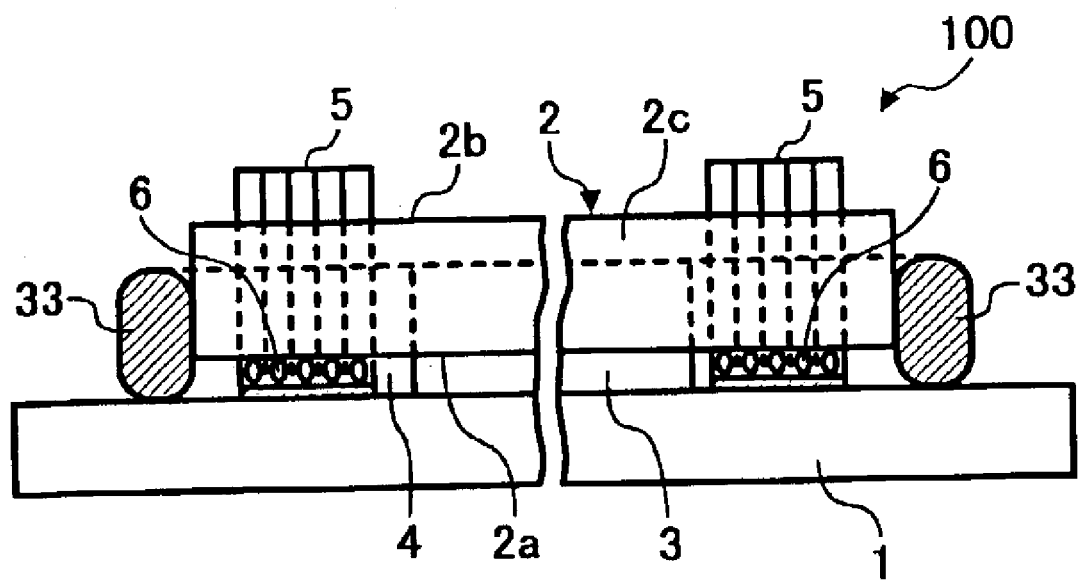
FIG. 23 is a cross-sectional view of the semiconductor device in which power supplying devices are in intimate contact with a substrate according to an alternative example.

Instead of providing the slight gap 7 between the power supplying device 5 and the substrate 1, as illustrated in FIG. 23, the power supplying device 5 may be in intimate contact with the substrate 1 and be made of a soft material having greater elasticity than that of the adhesive materials 3. This construction prevents the passage of air, moisture, and foreign substances between the power supplying device 5 and the substrate 1. In this construction, even if the substrate 1 expands and contracts, the power supplying device 5 can elastically move, so that the conjunction portion between the power supplying device 5 and the semiconductor chip 2 is not broken. Thus, the power supplying device 5 may contact the substrate 1 so long as the conjunction portion between the power supplying device 5 and the semiconductor chip 2 can be moved relative to the substrate 1.

Instead of making the power supplying device 5 have the elasticity by itself, the same effects can be achieved by sticking rubber or applying an adhesive material onto the surface of the power supplying device 5 or the substrate 1. In place of the rubber a gel material may be used. Further, a liquid seal member may be applied to the surface of the power supplying device 5 or the substrate 1.

With regard to the adhesive material used for the sealing member 33, it is not preferable that the adhesive material flows into the gap 7 between the power supplying device 5 and the substrate 1 due to the low viscosity of the adhesive material before curing. In order to prevent the flow of the adhesive material into the gap 7, it is preferable that the surface of the power supplying device 5 facing the gap 7 be made of a member that repels the adhesive material of the sealing member 33. For example, the surface of the power supplying device 5 may be coated with fluorine or Teflon (trade mark), or have a Teflon (trade mark) tape thereon.

As a hard adhesive material 3 as the fixing member, the epoxy adhesive material of (OP-2070, Hardness D70) manufactured by Denki Kagaku Kogyo Kabushiki Kaisha may be used. As a soft adhesive material of the sealing member 33, the silicon ultraviolet curing adhesive of (5088, Hardness D30) manufactured by Loctite Japan corporation may be used.

Alternatively, as a hard film adhesive material 3, the epoxy heat-curing film adhesive of (564AKEM, Young's modulus 1080) manufactured by Ablestik Co., Ltd. may be used. As a soft adhesive material of the sealing member 33, a silicon heat-curing film adhesive (THERMALWAFERS, low Young's modulus) manufactured by Ablestik Co., Ltd. may be used.

As a foaming material having hermeticity of the sealing member 33, a foaming agent of Neothlene series manufactured by Eiwa chemical Ind. Co., Ltd. may be used as a main agent in a mixture. Rubber or resins may be used as a main agent as well.

In the above-described image scanning unit 40 and the image forming apparatus using the image scanning unit 40, the breakage of the conjunction portion between the solid-state imaging device 20 and the power supplying device 5 caused by heat is prevented. Further, the adhesive material does not interfere with a light path. Moreover, the optical functional surface 20a of the solid-state imaging device 20 is protected from moisture and foreign substances by the adhesive material 3 and the sealing member 33. Therefore, the solid-state imaging device 20 can adequately function as an optical functional component without causing an image scanning error, and an electrostatic latent image can be formed on the photoreceptor 115 with high accuracy. Thereby, a high quality image can be formed in the image forming apparatus.

The present invention has been described with respect to the embodiments as illustrated in the figures. However, the present invention is not limited to the embodiment and may be practiced otherwise.

Numerous additional modifications and variations of the present invention are possible in light of the above teachings. It is therefore to be understood that within the scope of the appended claims, the present invention may be practiced otherwise than as specifically described herein.

What is claimed:

1. A semiconductor device comprising:
   a semiconductor chip including a functional surface;
   a substrate configured to support the semiconductor chip, the substrate opposing the functional surface of the semiconductor chip at a space formed between the substrate and the functional surface;
   a power supplying device configured to supply electric power to the semiconductor chip while being electrically connected to a part of the functional surface of the semiconductor chip, wherein the power supplying device is interposed between the functional surface of the semiconductor chip and the substrate, and the power supplying device is in close proximity with substrate;
   a fixing member configured to fix the semiconductor chip to the substrate, the fixing member being disposed beside a part of the functional surface of the semiconductor chip other than a part of the functional surface of the semiconductor chip connected to the power supplying device; and
   a sealing member configured to seal the space formed between the substrate and the functional surface of the semiconductor chip other than a space formed between the substrate and the functional surface of the semiconductor chip that are fixed to each other through the fixing member and other than a gap formed between the power supplying device and the substrate,
   wherein the sealing member has greater elasticity than the fixing member.

2. The semiconductor device according to claim 1, wherein the fixing member comprises an adhesive material, and the sealing member comprises an adhesive material having greater elasticity than the adhesive material of the fixing member.

3. The semiconductor device according to claim 1, wherein the sealing member comprises a foaming material.

4. The semiconductor device according to claim 1, wherein a contact angle of at least one of a surface of the substrate and a surface of the power supplying device that form the gap between the substrate and the power supplying device relative to the sealing member is greater than a contact angle of a part of the surface of the substrate not facing the gap relative to the sealing member.

5. The semiconductor device according to claim 1, wherein the sealing member comprises a film adhesive material.

6. The semiconductor device according to claim 1, wherein at least one of the fixing member and the sealing member comprises a photo-curing type adhesive material.

7. The semiconductor device according to claim 1, wherein at least one of the fixing member and the sealing member comprises a heat-curing type adhesive material having a curing temperature lower than a temperature causing breakage of electrical connection between the semiconductor chip and the power supplying device.

8. The semiconductor device according to claim 1, wherein at least one of the fixing member and the sealing member comprises a thermoplastic type adhesive material having a softening temperature lower than a temperature causing breakage of electrical connection between the semiconductor chip and the power supplying device.

9. The semiconductor device according to claim 1, wherein the sealing member comprises an adhesive material coated with a cured adhesive material.

10. The semiconductor device according to claim 9, wherein the sealing member has a circular-shaped cross-section.

11. The semiconductor device according to claim 9, wherein the sealing member has a polygonal-shaped cross-section.

12. The semiconductor device according to claim 1, wherein the sealing member comprises an adhesive material holding element and an adhesive material held by the adhesive material holding element.

13. The semiconductor device according to claim 12, wherein the adhesive material holding element comprises a sponge material.

14. The semiconductor device according to claim 13, wherein the adhesive material holding element has a light transparent property.

15. The semiconductor device according to claim 12, wherein the adhesive material holding element comprises an aggregated body of fibers.

16. The semiconductor device according to claim 15, wherein the adhesive material holding element has a light transparent property.

17. The semiconductor device according to claim 1, wherein the substrate comprises a light transparent material, and the functional surface of the semiconductor chip comprises an optical functional surface, and a light incident space is formed between the optical functional surface of the semiconductor chip and the substrate.

18. The semiconductor device according to claim 17, wherein at least one of the fixing member and the sealing member comprises a photo-curing type adhesive material.

19. The semiconductor device according to claim 17, wherein at least one of the fixing member and the sealing member comprises a heat-curing type adhesive material having a curing temperature lower than a temperature causing breakage of electrical connection between the semiconductor chip and the power supplying device.

20. The semiconductor device according to claim 17, wherein at least one of the fixing member and the sealing member comprises a thermoplastic type adhesive material having a softening temperature lower than a temperature causing breakage of electrical connection between the semiconductor chip and the power supplying device.

21. The semiconductor device according to claim 17, wherein the semiconductor chip comprises a solid-state imaging device.

22. An image scanning unit, comprising: an optical element; and the semiconductor device of claim 21.

23. An image forming apparatus, comprising: an image carrier configured to carry an image; and the image scanning unit of claim 22.

24. The semiconductor device according to claim 1, wherein a surface of the semiconductor chip on the opposite side of the functional surface is exposed to outside for radiating heat.

25. The semiconductor device according to claim 24, wherein the semiconductor chip comprises a solid-state imaging device.

26. An image scanning unit, comprising: an optical element; and the semiconductor device of claim 25.

27. An image forming apparatus, comprising: an image carrier configured to carry an image; and the image scanning unit of claim 26.

28. The semiconductor device according to claim 1, further comprising a heat radiating device on a surface of the semiconductor chip on the opposite side of the functional surface.

29. The semiconductor device according to claim 28, wherein the semiconductor chip comprises a solid-state imaging device.

30. An image scanning unit, comprising: an optical element; and the semiconductor device of claim 29.

31. An image forming apparatus, comprising: an image carrier configured to carry an image; and the image scanning unit of claim 30.

32. A semiconductor device comprising:

a semiconductor chip including a functional surface;

a substrate configured to support the semiconductor chip, the substrate opposing the functional surface of the semiconductor chip at a space formed between the substrate and the functional surface;

a power supplying device configured to supply electric power to the semiconductor chip while being electrically connected to a part of the functional surface of the semiconductor chip, wherein the power supplying device is interposed between the functional surface of the semiconductor chip and the substrate, and the power supplying device is in intimate contact with the substrate;

a fixing member configured to fix the semiconductor chip to the substrate, the fixing member being disposed beside a part of the functional surface of the semiconductor chip other than a part of the functional surface of the semiconductor chip connected to the power supplying device; and a sealing member configured to seal the space formed between the substrate and the functional surface of the semiconductor chip other than a space formed between the substrate and the functional surface of the semiconductor chip that are fixed to each other through the fixing member, wherein the sealing member has greater elasticity than the fixing member.

33. A semiconductor device comprising:

a semiconductor chip including a functional surface;

supporting means for supporting the semiconductor chip, the supporting means opposing the functional surface of the semiconductor chip at a space formed between the supporting means and the functional surface;

power supplying means for supplying electric power to the semiconductor chip while being electrically connected to a part of the functional surface of the semiconductor chip, wherein the power supplying means is interposed between the functional surface of the semiconductor chip and the supporting means, and the power supplying means is in close proximity with the supporting means;

fixing means for fixing the semiconductor chip to the supporting means, the fixing means being disposed beside a part of the functional surface of the semiconductor chip other than a part of the functional surface of the semiconductor chip connected to the power supplying means; and sealing means for sealing the space formed between the supporting means and the functional surface of the semiconductor chip other than a space formed between the supporting means and the functional surface of the semiconductor chip that are fixed to each other through the fixing means and other than a gap formed between the power supplying means and the supporting means, wherein the sealing means has greater elasticity than the fixing means.

* * * * *